(12) United States Patent
Kawamura et al.

(10) Patent No.: US 7,317,634 B2
(45) Date of Patent: Jan. 8, 2008

(54) NONVOLATILE SEMICONDUCTOR MEMORY DEVICE

(75) Inventors: Tetsufumi Kawamura, Kokubunji (JP); Yoshitaka Sasago, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 66 days.

(21) Appl. No.: 11/340,686

(22) Filed: Jan. 27, 2006

(65) Prior Publication Data

US 2006/0171207 A1    Aug. 3, 2006

(30) Foreign Application Priority Data

Jan. 28, 2005   (JP) ............................. 2005-021936
Jan. 12, 2006   (JP) ............................. 2006-004664

(51) Int. Cl.
*G11C 11/34* (2006.01)
*G11C 16/04* (2006.01)

(52) U.S. Cl. ........................... 365/185.14; 365/185.28; 365/185.18

(58) Field of Classification Search ................ 365/185
See application file for complete search history.

(56) References Cited

U.S. PATENT DOCUMENTS

| | | | | |
|---|---|---|---|---|
| 5,455,792 A | * | 10/1995 | Yi | 365/185.15 |
| 5,856,943 A | * | 1/1999 | Jeng | 365/185.14 |
| 5,943,261 A | * | 8/1999 | Lee | 365/185.14 |
| 6,034,892 A | * | 3/2000 | Choi | 365/185.14 |
| 6,246,612 B1 | * | 6/2001 | Van Houdt et al. | 365/185.29 |
| 2004/0084714 A1 | | 5/2004 | Ishii et al. | 257/315 |

FOREIGN PATENT DOCUMENTS

JP    2004-152977    5/2004

OTHER PUBLICATIONS

H. Kurata et al., "Self-Boosted Charge Injection for 90-nm-Node 4-Gb Multilevel AG-AND Flash Memories Programmable at 16MB/s," 2004 Symposium on VLSI Circuits Digest of Technical Papers, pp. 72-73.

* cited by examiner

*Primary Examiner*—Amir Zarabian
*Assistant Examiner*—Michael Weinberg
(74) *Attorney, Agent, or Firm*—Miles & Stockbridge PC

(57) ABSTRACT

The programming speed of a nonvolatile semiconductor memory device used as a flash memory is increased as follows. First, second, and third assist gates, a control gate, as well as first and second storage nodes are created over a p-type well. In the course of a programming operation, first of all, the p-type well is set at 0V. Then, a first inversion layer created by setting the first assist gate at a voltage A is set at a voltage B and the second assist gate is set at a voltage C. Subsequently, a second inversion layer created by setting the third assist gate at a voltage D is set at a voltage E and the control gate is set at a voltage F to inject hot electrons generated on the surface of the p-type well in close proximity to the second assist gate into the second storage node.

4 Claims, 23 Drawing Sheets

| | PROGRAMMING WORD-LINE BIAS | REGION OF THRESHOLD VOLTAGE |
|---|---|---|
| "01" | Vww3 | Vth>V3 |
| "00" | Vww2 | V2L<Vth<V2H |
| "10" | Vww1 | V1L<Vth<V1H |
| "11" | Vww0 | V0L<Vth<V0H |

NONVOLATILE SEMICONDUCTOR MEMORY DEVICE

CLAIM OF PRIORITY

The present invention claims priority from Japanese application JP 2005-021936 filed on Jan. 28, 2005, and Japanese application JP 2005-004664 filed on Jan. 12, 2006, the contents of which are hereby incorporated by reference into this application.

FIELD OF THE INVENTION

The present invention relates to a nonvolatile semiconductor memory device. More particularly, the present invention relates to a technology effectively applicable to enhancement of the performance of an electrically programmable/erasable nonvolatile semiconductor memory device.

BACKGROUND OF THE INVENTION

As a nonvolatile semiconductor memory device allowing data to be electrically programmed/erased, there is known a so-called flash memory, data stored in which can be erased in a bulk erase operation. The flash memory has excellent mobility and an excellent shock endurance characteristic. The flash memory also allows data stored therein to be electrically erased in a bulk erase operation. Thus, in recent years, there is an abruptly rising demand for the flash memory to serve as a memory device of a personal digital assistant such as a mobile personal computer or a digital still camera. Most important things among demands for introduction of the flash memory to the market are a demand for reduction of the cost per bit and a demand for enhancement of the speed to program data into the flash memory.

The flash memories include flash memories of AND and NOR types. The reduction of the cost per bit has been implemented in some of the flash memories of the AND and NOR types by devising the device structure and introducing a multilevel storage concept. Moreover, by adoption of a source-side hot electron injection method, the enhancement of the speed to program data into the flash memories of these types has also been implemented.

For example, JP-A No. 152977/2004 serving as patent reference 1 discloses a technology for implementing the reduction of the cost per bit and the enhancement of the speed to program data into the flash memory at the same time by implementing bit lines existing inside a memory array as inversion layers, shrinking the memory-cell region and carrying out data programming operations through adoption of the source-side hot electron injection method.

In particular, since the flash memory of the AND type is used for storing information of a large amount, the number of memory cells involved in an operation to program data into the flash memory increases to a large value typically in the order of 1 kB. For this reason, it is necessary to increase the throughput of an operation to program data into a large number of memory cells at the same time. In an operation to program data into the flash memory by adoption of the source-side hot electron injection method, the programming characteristic appears to vary from memory cell to memory cell due to dispersions in assist gate shape and dispersions in set voltages. Since the dispersions in programming characteristic reduce the programming throughput per chip, it is necessary to decrease the dispersions.

On pages 72-73 of the Symposium on VLSI Circuits (2004) used as non-patent reference 1, a CCIP (Constant-Charge-Injection Programming) technology is disclosed. The CCIP technology is a countermeasure taken to reduce the number of dispersions in programming speed. Caused by dispersions in channel current, the dispersions in programming speed become a problem in a programming operation adopting the source-side hot electron injection method.

SUMMARY OF THE INVENTION

As the cost per bit is reduced and the amount of handled information increases, however, further enhancement of the programming speed is demanded.

In order to increase the speed of a programming operation adopting the source-side hot electron injection method, which is referred to simply as source-side injection, it is necessary to increase the speed of an operation to program data into every memory cell as explained in detail by referring to FIG. 22.

In general, in the source-side injection, the quantity $Q_g$ of electric charge injected into a storage node 51 is represented by an equation of $Q_g = Q_j \times \gamma$, where notation $Q_j$ denotes the quantity of electric charge moving between a source 130 and a drain 132 whereas notation $\gamma$ denotes the efficiency of injection of hot electrons. The injection efficiency $\gamma$ is a function of the voltage at the storage node 51, the voltage at the drain 132, the voltage at the source 130, and the voltage at an assist gate 11. Even though the injection efficiency $\gamma$ actually changes during a programming operation, in this case, the injection efficiency $\gamma$ is approximated to a constant.

In the past, 2 methods described below were adopted to raise the speed of a programming operation adopting the source-side injection in a memory cell of a certain structure.

The first method is a method whereby a voltage at a drain is increased to raise a difference in voltage between a source and the drain and, hence, raise an injection efficiency $\gamma$. If the voltage at the drain is increased, however, a so-called drain disturbance is enhanced in a memory cell on an unselected word line. In the drain disturbance, electrons injected into a storage node are pulled out to the drain. In addition, even with the voltage of the drain increased, if a voltage at the storage node is not sufficiently high, a voltage appearing on the surface of the substrate under the storage node drops, raising a problem that an electric field generated on a boundary between a lower portion of an assist gate and the surface of the substrate under the storage node is not so large.

According to the second method, voltages appearing at a control gate and other elements are increased to raise the voltage at the storage node by a coupling effect. Thus, an electric field for pulling in hot electrons is strengthened to raise the injection efficiency $\gamma$. If the voltages appearing at the control gate and other elements are increased, however, a voltage at a storage node in a cell on an unselected bit line also rises, raising a problem of an enhanced disturbance in which electrons are injected by F-N (Fowler-Nordheim) injection.

As described above, with a programming method based on the conventional source-side injection, the speed of the programming operation is determined by a trade-off with the speed of the disturbance described above. It is thus difficult to raise the speed of the programming operation.

Therefore, a problem raised in a programming operation adopting the source-side injection is how to raise the speed of an operation to program data into each memory cell without raising the speed of the disturbance or losing an effect of reducing dispersions of characteristics of the programming operation implemented by adoption of the constant electric charge injection programming method.

It is thus an object of the present invention to provide a technology for increasing a programming speed of a nonvolatile semiconductor memory device.

The above and other objects of the present invention as well as new characteristics thereof will probably become apparent from descriptions of this specification and drawings attached thereto.

Outlines of representatives of inventions disclosed in this specification are explained briefly as follows.

(1): According to one aspect of the present invention, there is provided a nonvolatile semiconductor memory device comprising:

first, second, and third electrodes provided over a semiconductor substrate of a first conduction type, sandwiching a first insulator film in conjunction with said semiconductor substrate as electrodes parallel to each other in a first direction;

a fourth electrode extended in a second direction essentially perpendicular to said first direction, sandwiching a second insulator film in conjunction with said first, second, and third electrodes as an electrode for controlling a voltage appearing on a surface of said semiconductor substrate between said first and second electrodes and a voltage appearing on a surface of said semiconductor substrate between said second and third electrodes;

a first storage node created between said first and second electrodes and enclosed by an insulator film provided in the surroundings of said first storage node; and a second storage node created between said second and third electrodes and enclosed by an insulator film provided in the surroundings of said second storage node, said nonvolatile semiconductor memory device carrying out a programming operation including the steps of:

(a): setting said semiconductor substrate at 0V;
(b): setting said first electrode at a voltage A with a first sign to create a first inversion layer on a surface of said semiconductor substrate in close proximity to said first electrode;
(c): setting said first inversion layer at a voltage B with a second sign;
(d): setting said second electrode at a voltage C with said first sign and an absolute magnitude smaller than said voltage A, 0V, or with said second sign;
(e): setting said third electrode at a voltage D with said first sign to create a second inversion layer on a surface of said semiconductor substrate in close proximity to said third electrode;
(f): setting said second inversion layer at a voltage E with said first sign and an absolute magnitude smaller than said voltage D; and
(g): setting said fourth electrode at a voltage F with said first sign to inject hot carriers generated on a surface of said semiconductor substrate in close proximity to said second electrode into said second storage node.

(2): According to another aspect of the present invention, there is provided a nonvolatile semiconductor memory device comprising:

first and second diffusion layers provided in parallel to each other in a first direction on the surface of a semiconductor substrate of a first conduction type as layers having a second conduction type;

a first electrode provided in said first direction over said semiconductor substrate between said first and second diffusion layers, sandwiching a first insulator film in conjunction with said semiconductor substrate as an electrode having no region overlapping said first and second diffusion layers;

a second electrode extended in a second direction essentially perpendicular to said first direction, sandwiching a second insulator film in conjunction with said first electrode as an electrode for controlling voltages appearing on surfaces of said semiconductor substrate on both sides of said first electrode;

a first storage node created adjacently to said first electrode between said first electrode and a space over said first diffusion layer, being enclosed by an insulator film provided in the surroundings of said first storage node; and a second storage node created adjacently to said first electrode between said first electrode and a space over said second diffusion layer, being enclosed by an insulator film provided in the surroundings of said second storage node, said nonvolatile semiconductor memory device carrying out a programming operation including the steps of:
(a): setting said semiconductor substrate at 0V;
(b): setting said first diffusion layer at a voltage B with a second sign;
(c): setting said first electrode at a voltage C with a first sign, 0V, or with said second sign;
(d): setting said second diffusion layer at a voltage E with said first sign; and
(e): setting said second electrode at a voltage F with said first sign to inject hot carriers generated on a surface of said semiconductor substrate in close proximity to said first electrode into said second storage node.

(3): According to a further aspect of the present invention, there is provided a nonvolatile semiconductor memory device comprising:

first and second diffusion layers each created on the surface of a semiconductor substrate with a first conduction type as layers each having a second conduction type;

a first electrode created over said semiconductor substrate between said first and second diffusion layers, sandwiching a first insulator film in conjunction with said semiconductor substrate as an electrode having a region overlapping said first diffusion layer; and a first storage node created adjacently to said first electrode over said semiconductor substrate between said first and second diffusion layers, sandwiching a second insulator film in conjunction with said semiconductor substrate and enclosed by an insulator film provided in the surroundings of said first storage node as a node having a region overlapping said second diffusion layer, said nonvolatile semiconductor memory device carrying out a programming operation including the steps of:
(a): setting said semiconductor substrate at 0V;
(b): setting said first inversion layer at a voltage B with a second sign;
(c): setting said first electrode at a voltage I having said second sign; and
(d): setting said second diffusion layer at said voltage E with a first sign to inject hot carriers generated in a border region between a surface of said semiconductor substrate in close proximity to said first electrode and a surface of said semiconductor substrate in close proximity to said first storage node into said first storage node.

An effect of representatives of the inventions disclosed in this specification is explained briefly as follows.

A nonvolatile semiconductor memory device having a high programming speed can be implemented.

DETAILED DESCRIPTION OF THE PREFERRED EMBODIMENTS

Figure 1:
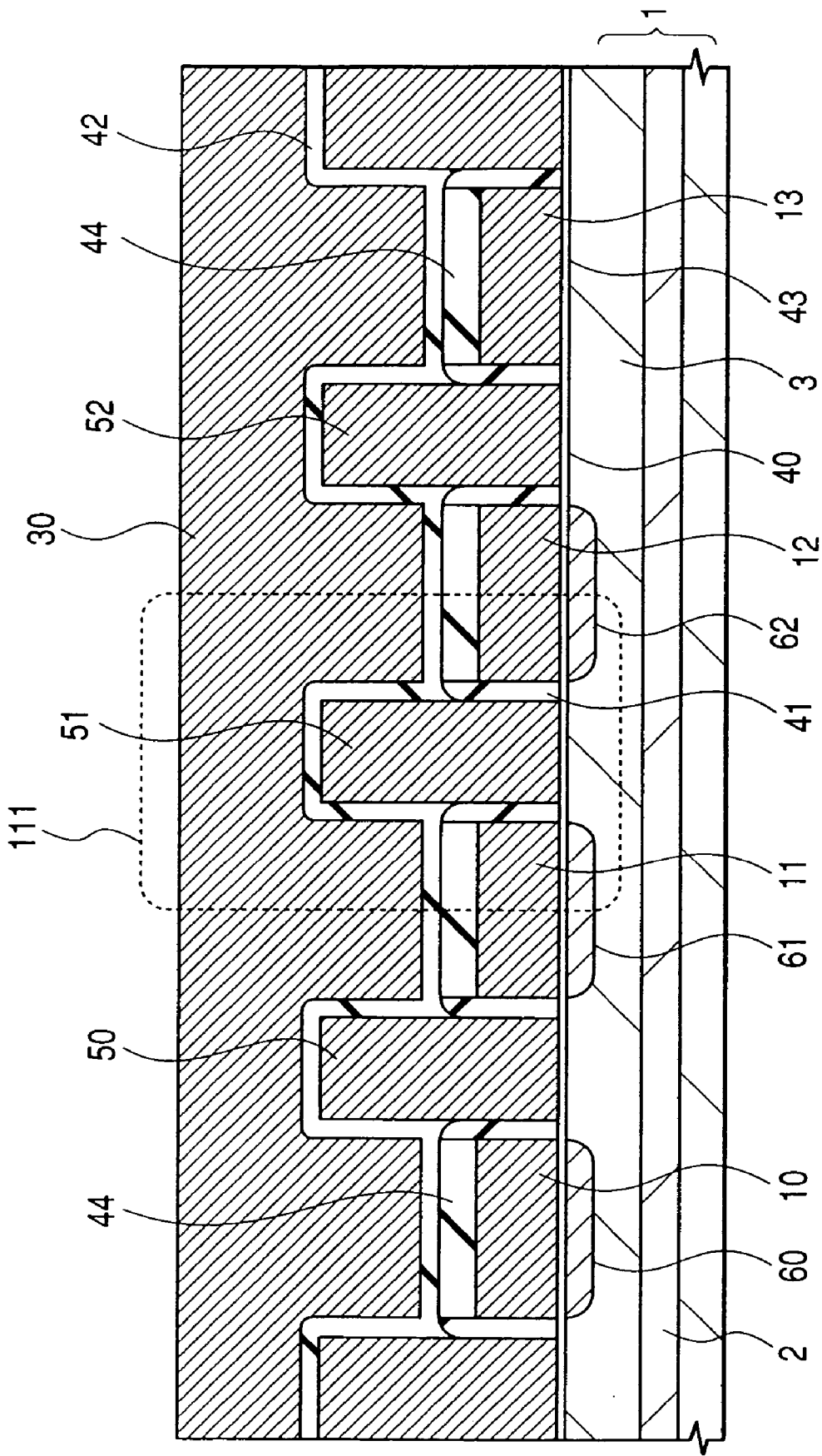
FIG. 1 is a diagram showing a cross section of principal elements composing a semiconductor substrate of a nonvolatile semiconductor memory device according to an embodiment of the present invention.

Embodiments of the present invention will be explained in detail by referring to diagrams. As a rule, members identical to each other are denoted by the same reference numeral throughout all the diagrams referred to in explaining the embodiments and explanation of the identical members is given only once to avoid duplications.

First Embodiment

FIG. 1 is a diagram showing a cross section of principal elements composing a semiconductor substrate of a nonvolatile semiconductor memory device according to a first embodiment of the present invention. In a semiconductor substrate made of p-type monolithic silicon, an n-type well 2 is created and, over the n-type well 2, a p-type well 3 is provided. In the following description, the semiconductor substrate 1 is referred to simply as a substrate.

Over the p-type well 3, assist gates 10, 11, 12, and 13 are created, sandwiching an insulator film 43 made of silicon oxide in conjunction with the p-type well 3. The assist gates 10 to 13 are each a gate for controlling a voltage appearing on the surface of the p-type well 3. Typically, the assist gates 10 to 13 are each made of an n-type polysilicon film. When a positive voltage is applied to the assist gates 10 to 12, inversion layers 60, 61 and 62 are created on the surface of the p-type well 3 below the assist gates 10 to 12.

In space regions between the adjacent assist gates 10 to 13, storage nodes 50, 51, and 52 are created, being electrically separated from the assist gates 10 to 13 by side-wall insulator films 41. The storage nodes 50 to 52 are each typically made of a polysilicon film. The concentration of impurities on the surface of the p-type well 3 below the assist gates 10 to 13 is different from the concentration of impurities on the surface of the p-type well 3 below the storage nodes 50 to 52.

Over the assist gates 10 to 13 and the storage nodes 50 to 52, a control gate 30 is provided. Including embedded word lines, the control gate 30 is typically a stacked-layer film comprising an n-type polysilicon film and a W (tungsten) film. The assist gates 10 to 13 are electrically separated from the control gate 30 by silicon oxide films 44. On the other hand, the storage nodes 50 to 52 are electrically separated from the control gate 30 by a silicon oxide film 42. Since the surroundings of the storage nodes 50 to 52 are each enclosed by an insulator film, the storage nodes 50 to 52 are each put in a floating state. A memory array is created into a configuration comprising repetition of such a structure.

Figure 2:
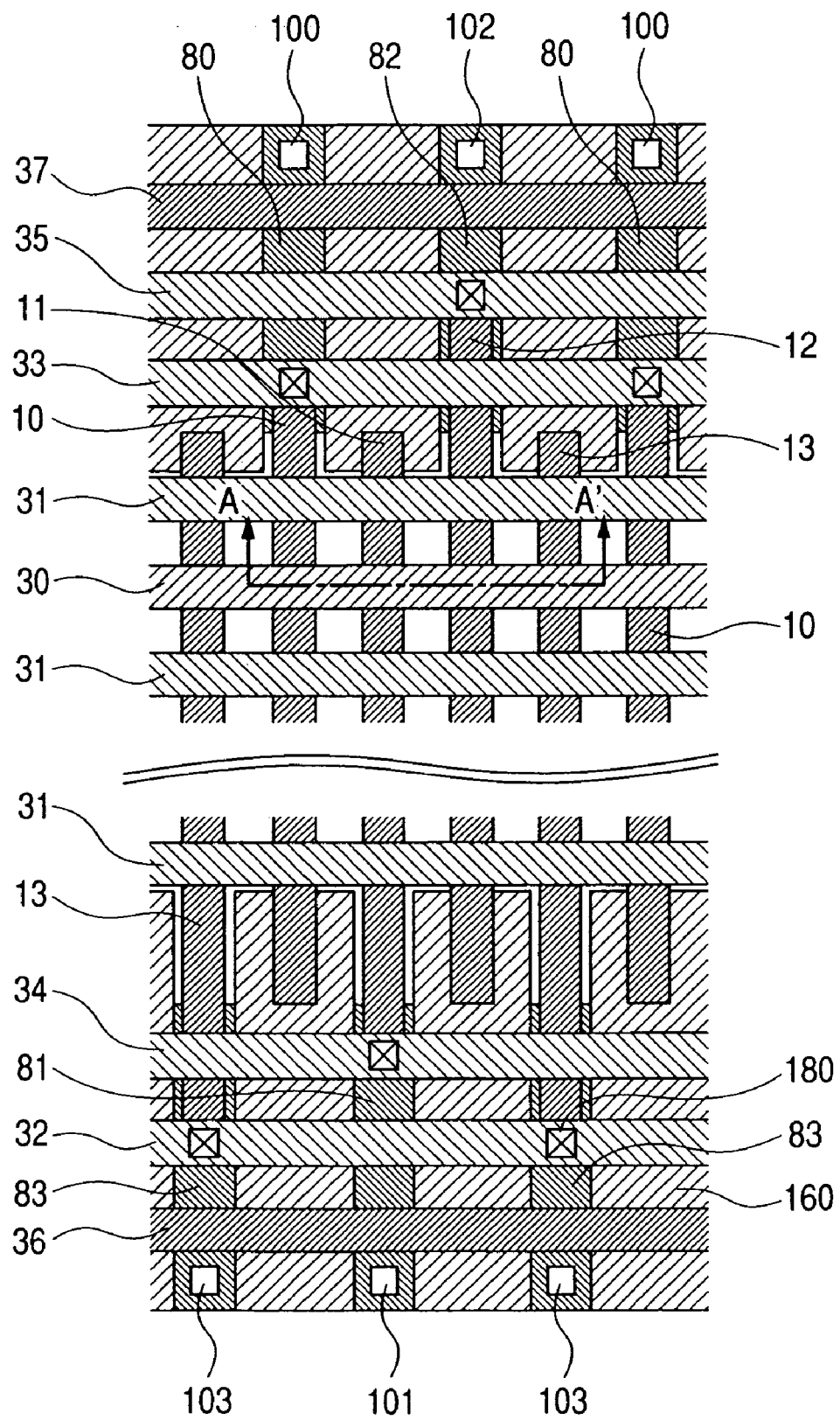
FIG. 2 is a diagram showing a top view of principal elements composing the semiconductor substrate of the nonvolatile semiconductor memory device according to the embodiment of the present invention.
Figure 3:
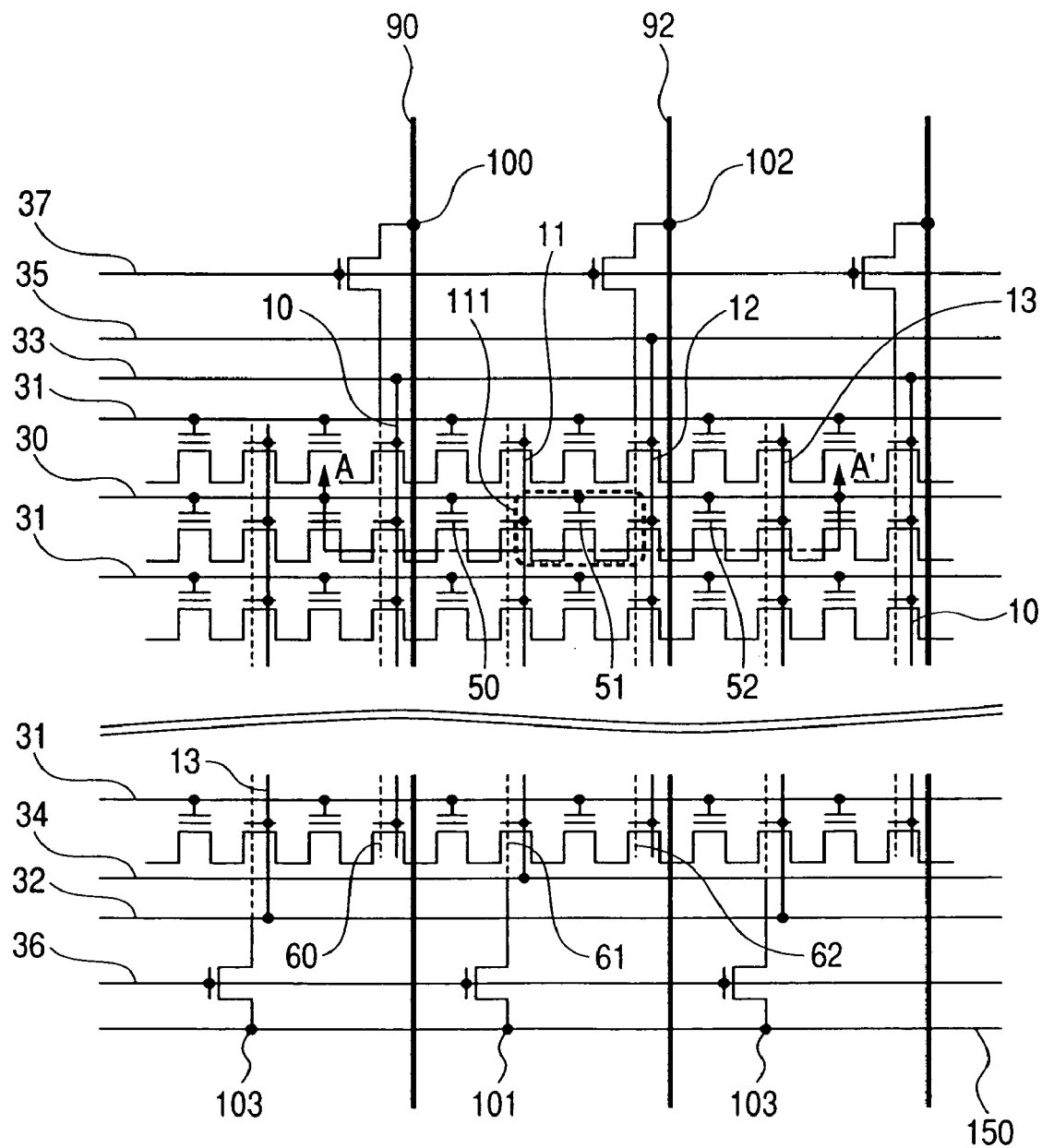
FIG. 3 is a circuit diagram showing principal elements composing the nonvolatile semiconductor memory device according to the embodiment of the present invention.

FIG. 2 is a diagram showing a top view of the memory array and FIG. 3 is a diagram showing an equivalent circuit of the memory array. Cross sections each indicated by a dotted line A-A' in FIGS. 2 and 3 correspond to the cross section shown in FIG. 1. In FIG. 3, wires of the inversion layers are each represented by a dashed line. On the other hand, an assist gate wire and a diffusion layer wire made of a high-concentration n-type impurity are each represented by a solid line. A metallic wire is omitted except metallic wire portions required for explanation.

A word line is extended in the right and left directions of the memory array. A word line is created repeatedly to form a configuration serving as a basic unit consisting of typically 128 or 256 word lines. On the upward and downward direction ends of the memory array, every 4 assist gates 10 to 13 are bound by contact holes 180 as well as electrodes 32, 33, 34, and 35 so that independent voltages can be applied to adjacent assist gates. In addition, on the upward and downward direction ends of the memory array, grooves 160 each filled with an insulator film exist to serve as an element separator. To be more specific, active regions 80 and 82 as well as 81 and 83 each containing injected n-type impurities are insulated from each other by the grooves 160. The inversion layers 60 to 62 created on the surfaces of p-type wells 3 on the lower portions of the assist gates 10 to 12 as layers to serve as local bit lines are connected to the active regions 80 to 82, respectively.

Between an electrode 35 for binding assist gates and contact holes 100 and 102, which extend from metallic wires serving as global bit lines 90 and 92 to the active regions 80 and 82, a first select MOS transistor having a gate 37 is provided. By the same token, between an electrode 32 for binding assist gates and contact holes 101 and 103, which extend from a metallic wire serving as a global bit line 150 to the active regions 81 and 83, a second select MOS transistor having a gate 36 is provided. Through the first select MOS transistor, the inversion layers 60 and 62 serving as local bit lines are connected to the global bit lines 90 and 92 whereas, through the second select MOS transistor, the inversion layer 61 serving as a local bit line is connected to a common source line 150.

The memory array described above is characterized in that the memory array includes a structure comprising the assist gates 10 to 13 overlapping the active regions 80 to 83. However, the assist gates 10 to 13 are insulated from the active regions 80 to 83 by an insulator film created on the surface of the p-type well 3. With this structure, for example, if the inversion layer 62 is created on the surface of the p-type well 3 below the assist gate 12 by applying a positive voltage to the assist gate 12, a voltage can be applied to the inversion layer 62 from the global bit line 92 through the active region 82. The ability to apply a voltage to the inversion layer holds true of an inversion layer created below another assist gate in the same way. That is, a voltage can be applied to a specific inversion layer independently of other inversion layers from a global bit line corresponding to the specific inversion layer.

Next, operations of a memory cell are explained. In this embodiment, 2 bits are stored in the storage node 51 between the assist gates 11 and 12 on the basis of 4 threshold-voltage levels.

Figures 22, 23:
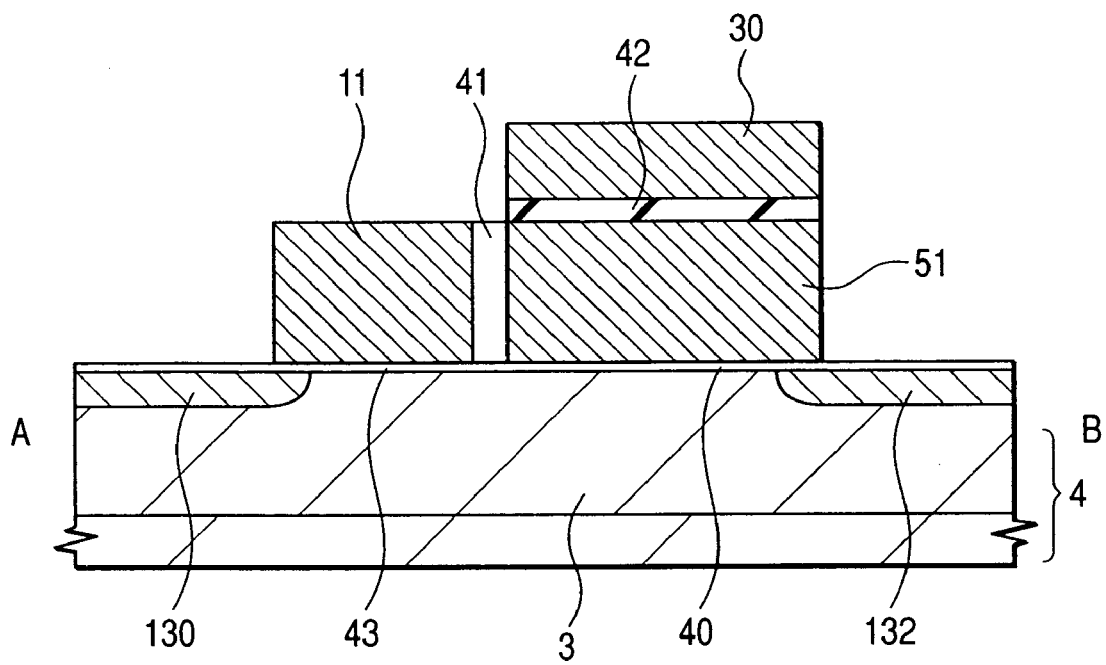
FIG. 22 is a diagram showing a cross section of principal elements composing a semiconductor substrate of a nonvolatile semiconductor memory device carrying out programming operations based on source-side injection.
FIG. 23 is a diagram showing a table associating threshold-voltage levels with information in a nonvolatile semiconductor memory device according to an embodiment of the present invention.

First of all, an operation to program information into a memory cell is described. FIG. 23 is a diagram showing a table associating threshold-voltage levels with information to be programmed into a memory cell. In the figure, the following relations hold true: V3>V2H>V2L>V1H>V1L>V0H>V0L. The pieces of information having values of "01", "00", "10" and "11" may be associated with threshold-voltage levels in different ways. The order of programming threshold-voltage levels can be any order. In this embodiment, however, information is programmed into a memory cell in a descending order starting with the highest threshold-voltage level. In addition, in this embodiment, a programming operation is started from a state set at "11". However, a programming operation can be started from another threshold voltage. Furthermore, in this embodiment, a programming operation is carried out by using the 3 adjacent assist gates 10, 11 and 12. Even though a programming procedure is not explained in particular, in this embodiment, the p-type well 3 is set at a fixed voltage of 0V throughout 1 cycle of the programming operation. Also in other embodiments to be described later, the p-type well is set at a fixed voltage of 0V throughout 1 cycle of the programming operation in the same way.

Figure 4:
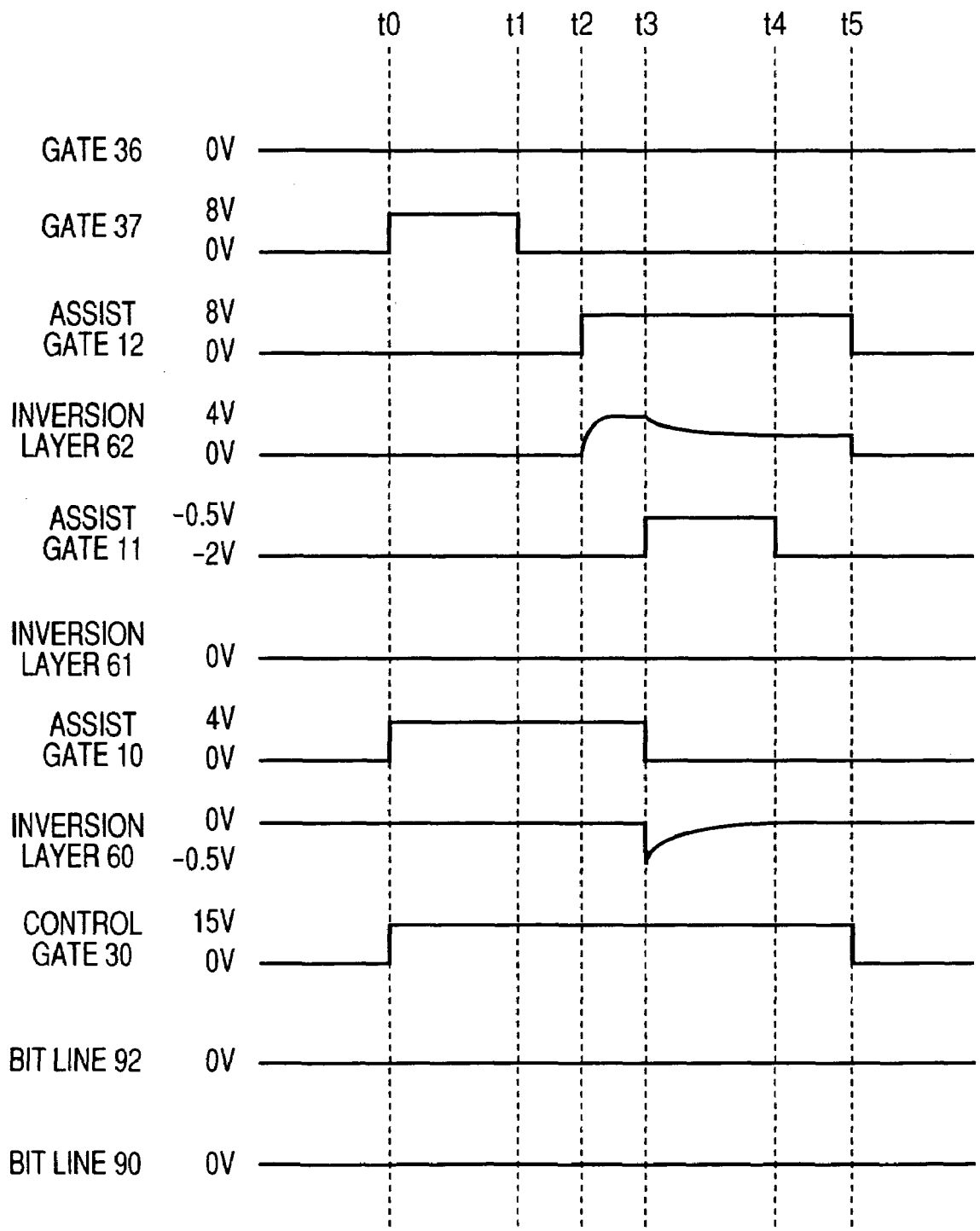
FIG. 4 shows timing diagrams of a procedure for applying voltages to members of an array of memory cells in a programming operation of the nonvolatile semiconductor memory device according to the embodiment of the present invention.

Next, a detailed programming procedure is explained by referring to FIG. 4. Assume for example that information having a value of "01" is programmed into a target memory cell 111. In this case, first of all, at a time t0, the control gate 30 (a fourth electrode) is activated by pulling up a voltage appearing thereon to 15V (a voltage F), which is a word voltage, and a voltage appearing on the gate 37 is pulled up to 8V to activate the select MOS transistor. At the same time, a voltage appearing on the assist gate 10 (a first electrode) is pulled up to 4V (a voltage A) to activate the assist gate 10 in order to create the inversion layer 60 below the assist gate 10. The inversion layer 60 receives power from the global bit line 90, being set at 0V.

Subsequently, at a time t1, a voltage appearing on the gate 37 is pulled down to 0V to deactivate the select MOS transistor and, hence, break a connection between the global bit line 90 and the inversion layer 60 and put the inversion layer 60 in a floating state. Thus, electrons are accumulated into the inversion layer 60 at a voltage of 0V.

Afterwards, at a time t2, the voltage at the assist gate 12 (a third electrode) is pulled up to 8V to activate the assist gate 12. At that time, the voltage at the gate 37 does not rise. Thus, the surface (a substrate surface) of the p-type well 3 below the assist gate 12 is put in a floating state. As the voltage at the assist gate 12 is pulled up to activate the assist gate 12, the voltage appearing on the surface of the p-type well 3 below the assist gate 12 is also pulled up due to coupling with the assist gate 12 to activate the surface. As a result, the inversion layer 62 (a second inversion layer) is created on the surface of the p-type well 3 below the assist gate 12 and a voltage at the inversion layer 62 is set at 4V (a voltage D). In this embodiment, an electric charge accumulated into the inversion layer 62 by coupling in this way is used for data programming. The quantity Qi of the electric charge accumulated in the inversion layer 62 is expressed by an expression of Ci×4 coulombs where notation Ci used in the expression denotes the capacitance of the inversion layer 62.

Then, at a time t3, when the assist gate 11 (a second electrode) is pulled up to a programming voltage of −0.5V (a voltage C) to activate the assist gate 11 and, at the same time, a voltage appearing on the assist gate 10 is pulled down to 0V to deactivate the assist gate 10, electrons accumulated in the inversion layer 60 flow to the inversion layer 62 by way of the surface of the p-type well 3 below the storage node 50, the surface of the p-type well 3 below the assist gate 11, and the surface of the p-type well 3 below the storage node 51. At that time, the voltage at the inversion layer 60 becomes negative transiently due to coupling with the assist gate 10 in a characteristic phenomenon of the embodiment. In this embodiment, the negative voltage is −0.5V.

Since regions other than the surface of the p-type well 3 below the assist gate 11 enter a low-resistance state, if a difference in voltage between the inversion layers 60 and 62 exists, an electric field is concentrated on the boundary between the surface of the p-type well 3 below the assist gate 11 and the surface of the p-type well 3 below the storage node 51, generating hot electrons. Due to the fact that the voltage at the control gate 30 is high, the generated hot electrons are attracted in the direction toward the control gate 30, flying over a potential barrier of a tunnel insulator film 40. The generated hot electrons are injected into the storage node 51 on the right side of the middle assist gate 11, causing information to be stored.

Then, at a time t4, the voltage at the assist gate 11 is pulled down to deactivate the assist gate 11 in order to terminate the injection of hot electrons into the storage node 51. Subsequently, at a time t5, the voltages appearing at the assist gate 12 and the control gate 30 are pulled down to 0V to deactivate the assist gate 12 and the control gate 30. What has been described above is the programming cycle of 1 cycle.

In the mean time, by setting an unselected control gate 31 at a sufficiently low voltage of typically −2V, the channel of the memory cell driven by the control gate 31 is put in a non-conductive state so that no operation to program information into a storage node below the control gate 31 is carried out. In the configuration of the memory array according to the embodiment, an assist gate 13 is used as an electrical element separator between adjacent memory cells. During a programming cycle, by setting the voltage at the assist gate 13 at a low level such as −2V, an operation to incorrectly program information into the storage node 52 can be avoided. In this case, the low level of the voltage is a level of such an order that no electrons flow on the surface of the p-type well 3 below the assist gate 13.

Figure 24:
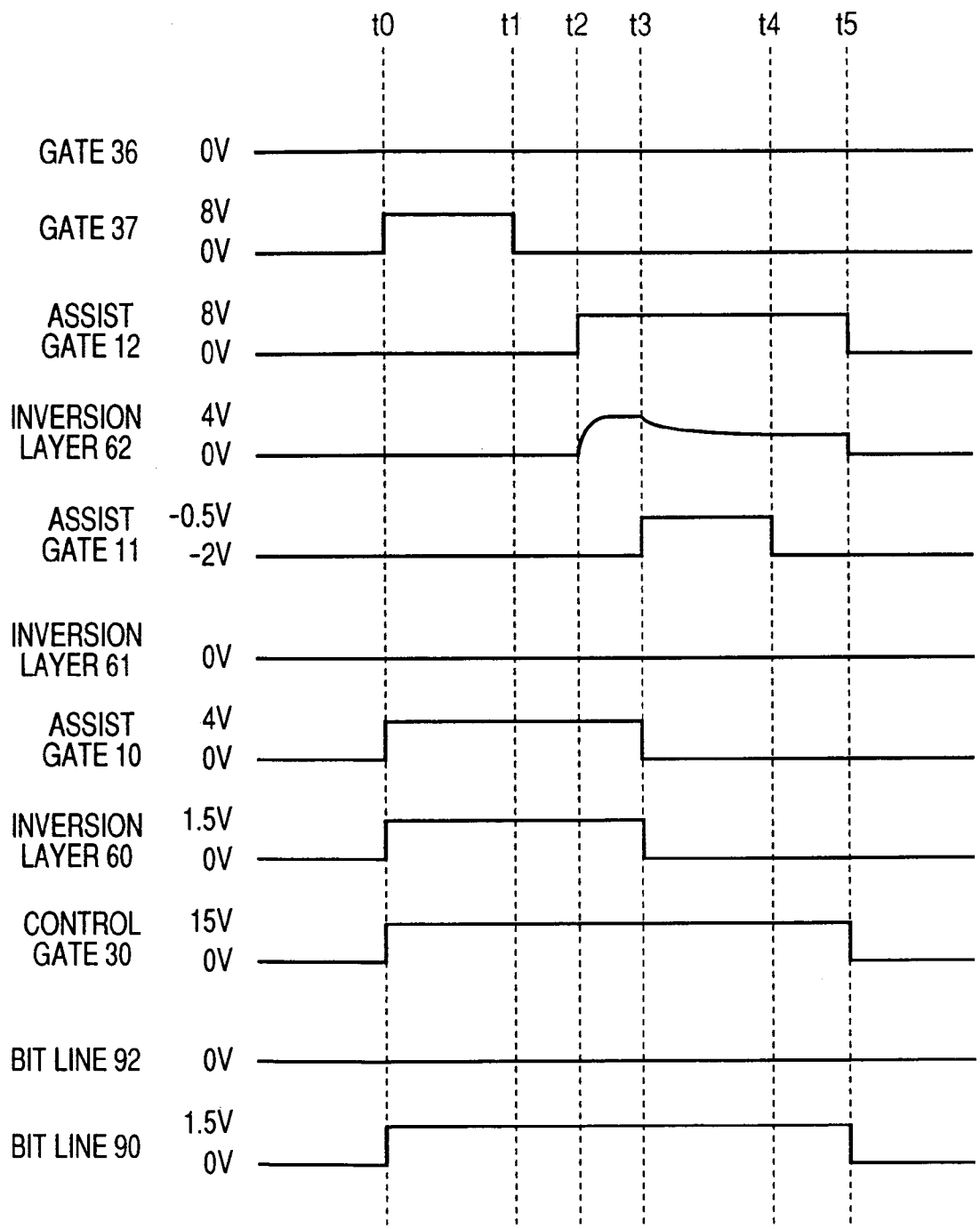
FIG. 24 shows timing diagrams of a procedure for applying voltages to members of an array of memory cells in a programming operation of a nonvolatile semiconductor memory device according to an embodiment of the present invention.

If it is desired to block an operation to program information into a memory cell, the voltage at the inversion layer 60 is set at about 1.5V by execution of a procedure like one shown in FIG. 24 to prevent a sufficient difference in voltage between the inversion layers 60 and 62 from being generated. Thus, no hot electrons are generated and no hot electrons are injected into the storage node 51. The method to prevent the operation to program information into a memory cell from being carried out is not limited to this technique. That is, another method can also be adopted. For example, by setting the voltage at the inversion layer 62 at about 0V, the programming operation can be avoided.

In order to program information into the storage node 50 on the left side of the assist gate 11, the voltages set at the assist gates 10 and 12 at both ends as well as the voltages set at the inversion layers 60 and 62 at both the ends are swapped with each other. Furthermore, it is possible to carry out a programming operation treating the assist gates 10 and 12, which are used in the programming operations described above as assist gates at both ends, like middle assist gates.

Subsequently, a read operation is carried out to examine a threshold voltage Vth in order to verify the threshold voltage Vth is higher than V3. The read operation will be described later in detail. If it is desired to program information having a value of "01" but the threshold voltage Vth is found not higher than V3, the predetermined voltages are set again and the programming operation is repeated according to the procedure described above. Subsequently, the read operation is carried out again to examine the threshold voltage. If necessary, the programming operation is further carried out to repeat the above sequence comprising the programming, read and verification operations. As described above, the operation is carried out to program information into a storage node 51 on the right side of the assist gate 11 in every fourth target memory cell among a plurality of memory cells driven by the same control gate 30. At a point of time all the target memory cells pass the process to verify the threshold voltage as described above, the programming sequence to program information having a value of "01" is completed.

Next, a programming sequence to program information having a value of "00" is explained. The predetermined voltages are set and the programming procedure described above is executed repeatedly. However, a voltage lower than Vww3 is used as the voltage Vww2 of the control gate 30. An example of the voltage lower than Vww3 is 12V. Thus, even if the same pulse width as the operation to program information having a value of "01" is used, a programming operation can be carried out with a smaller quantity of injected electric charge and at a lower level of the threshold voltage. The verification operation can also be carried in the same way. However, the operation to program information having a value of "00" is different from the operation to program information having a value of "01" in that, in the operation to program information having a value of "00", the threshold voltage is set at a level higher than V2L but lower than V2H. At a point of time all the target memory cells pass the process to verify the threshold voltage as described above, the programming sequence to program information having a value of "00" is completed.

Next a programming sequence to program information having a value of "10" into a memory cell is explained. The programming sequence to program information having a value of "10" is executed in the same way as the programming sequence to program information having a value of "00" except that, in the case of the programming sequence to program information having a value of "10", a voltage lower than Vww2 is used as the voltage Vww1 of the control gate 30 and the target threshold voltage is set in a range higher than V1L but lower than V1H. Then, the operations to program information into memory cells are completed.

In each operation to program information into a memory cell, the voltage of programming pulses applied to the control gate 30 is held at a constant level throughout the sequence. However, the voltage of the train of applied pulses can also be increased along with the increasing number of pulses applied so far in a programming sequence in order to complete the programming sequence in a short period of time. In addition, instead of varying the voltage at the control gate 30 from programming level to programming level, different levels are programmed in different ways determined by the number of applied pulses.

Next, a read operation is explained. Assume an operation to read out information from the storage node 51 into which the information has been programmed previously in a programming operation described above. First of all, the voltages of the gates 36 and 37 are set at 5V to put the inversion layer 61 and a common source line 150 in a conductive state, and to put the inversion layer 62 and the global bit line 92 in a conductive state. When a predetermined voltage Vs of typically 0V is set on the common source line 150 and the voltage at the assist gate 11 is set at Va of typically 4V which is higher than the voltage Vs, the inversion layer 61 is created below the assist gate 11 and a voltage about equal to Vs appears at the inversion layer 61. After the assist gate 12 is set at a voltage Vb of typically 5V to create the inversion layer 62 below the assist gate 12, the global bit line 92 and the inversion layer 61 are each pre-charged to a voltage Vdr of typically 1V, which is higher than Vs but lower then Vb. The voltages appearing at the assist gates 10 and 13 are each set at a low level Van of typically 0V. The level Van is so low that no electrons flow on the surface of the p-type well 3 below each of the assist gates 10 and 13. Thus, the elements are separated from each other at a read time.

In order to read out the 4 levels, first of all, the level of threshold voltage is examined to determine whether or not the level is not lower than "00", that is, whether or not the level is not lower than V2L, and determine whether or not the level is not higher than "10", that is, whether or not the level is not higher than V1H. Then, a voltage Vrw1 satisfying a relation of V1H<Vrw1<V2L is applied as a bias to the control gate 30. If the level of threshold voltage of the memory cell is not higher than V1H, a space between the inversion layer 62 and the inversion layer 61 enters a conductive state, and a current flows between the bit lines 91 and 92. If the level of threshold voltage of the memory cell is not lower than V2L, on the other hand, the space between the inversion layer 62 and the inversion layer 61 enters a non-conductive or high-resistance state, and no current flows between the bit lines 91 and 90. The determination process described above is carried out on the basis of whether or not a current flows between the bit lines 91 and 90. If the result of the level verification process indicates that the level of the threshold voltage of the memory cell is not higher than V1H, after a pre-charging process, a voltage Vrw0 satisfying a relation of V0H<Vrw0<V1L is applied as a bias to the control gate 30 and the flowing current is examined to determine whether the level is "11" or "10". If the result of the level verification process indicates that the level of the threshold voltage of the memory cell is not lower than V2L, on the other hand, after a pre-charging process, a voltage Vrw2 satisfying a relation of V2H<Vrw2<V3 is applied as a bias to the control gate 30 and the flowing current is examined to determine whether the level is "00" or "01".

In the read operation described above, instead of varying the condition of the voltage Vrw to be applied next as a bias to the control gate 30 to the condition of the voltage Vrw0 or Vrw2 according to a result of applying the voltage Vrw1, it is also possible to adopt a method whereby all read operations are carried out by application of the voltages Vrw0, Vrw1, and Vrw2 to read information from a memory cell. The former method is characterized in that only 2 read operations need to be carried out, allowing the operation speed to be increased. On the other hand, the latter method is characterized in that 3 read operations must be carried out but the control circuit can made simpler. With these driving methods, every other global bit line is driven at read times. By fixing the voltages appearing at bit lines adjacent to a driven bit line, driven bit lines can be shielded electrically from each other so that a stable read operation can be carried out and a voltage at the drain subjected to the read operation can be set at a low level of the order of 1V.

Next, an erase operation is explained. Information is erased in a bulk erase operation from a plurality of memory cells driven by a control gate common to the memory cells. To put it concretely, information is erased by applying a large negative voltage of typically −18V to the control gate 30. Thus, the voltage at the storage node containing injected electrons decreases and a strong electric field is applied to the tunnel insulator film 40. As a result, the electrons injected in the storage node are pulled out to the p-type well 3 so that the threshold voltage of the memory cell decreases. A different method can also be adopted as the erase method. For example, a positive voltage of typically 20V higher than Vww3 is applied as a bias to the control gate 30 to pull out injected electrons from the storage node to the control gate 30.

The following description explains a principle provided by the present invention as a principle to raise the programming speed and effects of the principle. As described before, this embodiment is characterized in that, by pulling down the voltage at the assist gate 10, the inversion layer 60 serving as the source is set by coupling transiently at a negative voltage of typically −0.5V. As a result, 3 effects explained below are obtained and the speed of the operation to program information into a memory cell is increased.

The quantity Qg of electric charge injected into the storage node 51 is expressed by an equation of $Qg=Qj\times\gamma$ where notation Qj denotes the quantity of electric charge moving between the inversion layers 60 and 62 whereas notation $\gamma$ denotes the efficiency of injection of hot electrons. The injection efficiency $\gamma$ is a function of the voltage at the storage node 51, the voltage at the inversion layer 62 serving as the drain, the voltage at the inversion layer 60 serving as the source, and the voltage at the assist gate 11. Even though the injection efficiency $\gamma$ actually changes during a programming operation, in this case, the injection efficiency $\gamma$ is approximated to a constant.

As the first effect, a difference in voltage between the inversion layers 60 and 62 at a programming time is increased in comparison with a case in which the voltage at the assist gate 10 is not reduced or a case in which the voltage at the inversion layer 60 is sustained at 0V. The increased difference in voltage between the inversion layers 60 and 62 raises the injection efficiency $\gamma$ of hot electrons.

As the second effect, a difference in voltage between the inversion layer 60 and the storage node 51 is increased in comparison with a case in which the voltage at the inversion layer 60 is sustained at 0V. The increased difference in voltage between the inversion layer 60 and the storage node 51 strengthens an electric field pulling generated hot electrons to the storage node 51 and, hence, raises the injection efficiency $\gamma$ of hot electrons.

Figure 25:
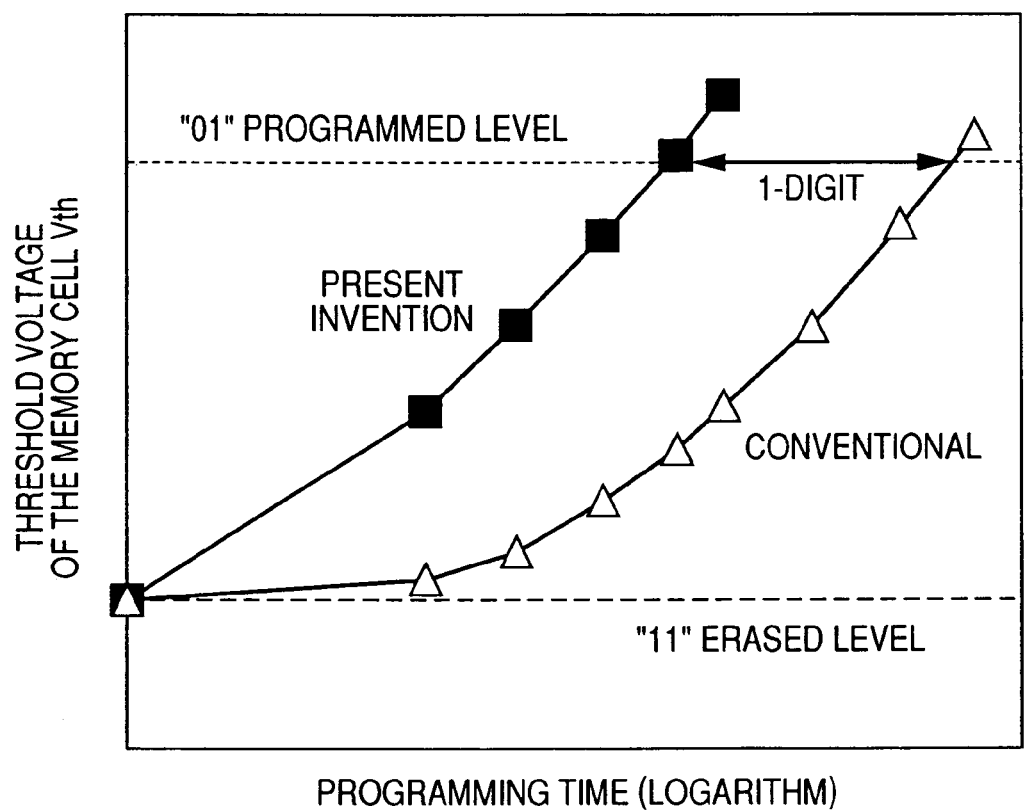
FIG. 25 shows graphs representing effects of an increased programming speed of a nonvolatile semiconductor memory device according to an embodiment of the present invention.

As the third effect, the programming operation can be carried out with the voltage of the assist gate 11 pulled down to a low level of typically −0.5V to deactivate the assist gate 11 and at a high injection efficiency $\gamma$. Since the lower the voltage at the assist gate 11, the stronger the electric field generated on the boundary between the surface of the p-type well 3 below the assist gate 11 and the surface of the p-type well 3 below the storage node 51, the lower the voltage at the assist gate 11, the higher the injection efficiency $\gamma$ of hot electrons. If the voltage at the inversion layer 60 is sustained at 0V, electrons are not capable of moving between the inversion layers 60 and 62 unless the assist gate 11 is kept at a sufficiently high voltage of typically 2V. As is the case with this embodiment, however, by bringing the inversion layer 60 to a negative voltage of typically −0.5V, a sufficient number of electrons are capable of moving between the inversion layers 60 and 62 as an electric charge of the electric-charge quantity Qj even if the assist gate 11 is kept at a voltage of −0.5V. Thus, information can be stored in the storage node 51 at a high injection efficiency $\gamma$. By applying the present invention, the time it takes to program the "01" programming level can be shortened substantially in comparison with the prior art, in which the voltage at the inversion layer 60 serving as the source is sustained at 0V, as shown in FIG. 25. In addition, naturally, no disturbance described in the explanation of problems to be solved by the present invention occurs.

Next, effects provided by the embodiment are described. This embodiment allows the speed of an operation to program information onto memory cells to be increased and, at the same time, the cost of the memory device to be reduced. In the memory configuration according to this embodiment, since no diffusion-layer wire exists in the memory array, the memory device can be manufactured at a small pitch between assist gate wires. Thus, the area of the memory cell can be reduced and a low-cost memory device can be realized.

In the programming operation according to this embodiment, the surface of the p-type well 3 below the assist gate 11 is put in a conductive state displaying a high resistance. Thus, the voltage at the assist gate 11 can be set at a relatively low level to allow an operation to be carried out in a sub-threshold region. For this reason, dispersions of dimensions of the assist gate 11 and dispersions of a voltage applied as a bias to the assist gate 11 bring about dispersions of the quantity Qj of electric charge moving between the inversion layers 60 and 62 as well as dispersions in injection efficiency $\gamma$ and, hence, dispersions of characteristics of programming information into memory cells. If the thickness of the gate oxide film below the assist gate 11 is 9 nm, for example, dispersions of ±0.1V in the voltage at the assist gate 11 lead to dispersion of 1-digit number in number of electrons injected into the storage node 51.

According to the programming procedure, operations to apply a programming bias and verify the threshold voltages of a plurality of memory cells subjected to a programming operation at the same time are carried out repeatedly till the threshold voltages each become equal to a desired value. For this reason, if dispersions in memory-cell programming characteristics exist, the number of times the operations to apply a programming bias and verify the threshold voltages must be carried out repeatedly increases and the time it takes to carry out the programming operation becomes longer. In particular, in implementation of a multilevel memory allowing data of at least 2 bits to be stored in every memory cell, it is necessary to suppress the width of the threshold-voltage distribution corresponding to pieces of data to a small value. In consequence, the dispersions in memory-cell programming characteristics increase the time it takes to carry out the operation to program information into a memory cell, raising in turn a serious problem.

According to the constant-charge-injection programming method disclosed in non-patent reference 1, a programming operation is carried out by adoption of a method whereby, in order to reduce the dispersions in memory-cell programming characteristics, the source voltage of the inversion layer 60 is charged from an internal power supply of 0V and the 4V-drain voltage of the inversion layer 62 is charged by coupling with the assist gate 12. An effect of the voltage at the assist gate 11 on the injection efficiency $\gamma$ is relatively small. For example, when the voltage at the assist gate 11 changes by ±0.1V, the injection efficiency $\gamma$ changes only by about 0.3-digit. Thus, according to the constant-charge-injection programming method, since the quantity Qj of electric charge moving between inversion layers is about constant, dispersions in Qg, which represent programming characteristics can be suppressed to about 0.3-digit.

According to the constant-charge-injection programming method, however, since Qj decreases, Qg also becomes smaller as well, raising a problem of a low programming speed of each memory cell. Particularly, in an operation to program the "01" level requiring a big threshold voltage shift, the number of times the bias is applied increases. That is, even though the number of times the programming bias is applied repeatedly and the number of times the threshold voltage is verified repeatedly are decreased by reduction of dispersions, the number of times the bias is applied for the threshold voltage shift is increased. Thus, the time it takes to carry out the operation to program information into a memory cell is long.

In this embodiment, a programming operation is carried out by adoption of a method whereby, the 4V-drain voltage of the inversion layer 62 is charged by coupling with the assist gate 12. At that time, the voltage at the assist gate 11 is set at a low level of typically −0.5V and the source is set at a negative voltage in order to increase the injection efficiency $\gamma$. Thus, with the effect of the reduction of dispersions in memory-cell programming characteristics reaped as it is, the speed of an operation to program information onto memory cells can be increased and, hence, the time it takes to carry out the operation to program information into a memory device can be shortened.

In addition, in this embodiment, since by the coupling with the surface of the p-type well 3 below the assist gate 12 generates a drain voltage at the inversion layer 62 whereas by the coupling with the surface of the p-type well 3 below the assist gate 10 generates a source voltage of typically −0.5V at the inversion layer 60, a power-supply circuit for the drain and the source is not necessary. Thus, a stable programming operation can be implemented without providing noises from power supplies of the drain and the source to the assist gate 11 at a programming time. In addition, the size of the power-supply circuit can be decreased considerably.

This embodiment can also be designed into the following configuration. In the embodiment described so far, the conduction type of the well is the p type using electrons as carriers. It is needless to say, however, that the n type using holes as carriers can also be taken as the conduction type of the well. In this case, the relations between the magnitudes of voltages are inverted from those described above. The configuration taking the n type as the conduction type is also applicable to embodiments described later as other embodiments of the present invention.

The storage node provided by this embodiment is made of a polysilicon film. However, the storage node can also be made of another semiconductor material or a metallic material. Instead of a piece of polysilicon as is the case with this embodiment, a plurality of infinitesimal silicon crystals or insulators having electric-charge traps can also be used. If the infinitesimal silicon crystals and/or insulators having electric-charge traps are used, electric charges can be injected discretely at 2 locations close to assist gates adjacent to each other on both sides. Thus, the difference of the locations for storing electric charges allows a multilevel storage to be implemented. The configuration of the storage node described above can also be adopted for all other embodiments of the present invention as well.

In addition, the embodiment employs the silicon oxide film 42 as an insulator film for electrically separating the storage node 51 and the control gate 30 from each other. However, a silicon oxide film containing nitrogen as an additive can also be used. The silicon oxide film containing nitrogen is characterized in that a trap is hardly generated at a programming/erase time in comparison with the simple silicon oxide film and there are only few characteristic fluctuation. In addition, it is also possible to adopt a stacked-film structure including an oxide silicon film and a silicon nitride film. Such a stacked-film structure is characterized in that a current hardly flows at the time a strong electric field is applied and reliability of the memory device is excellent. The configuration described above as the configuration of the insulator film can also be adopted for all other embodiments of the present invention as well.

This embodiment employs the silicon oxide film 44 as an insulator film for electrically separating the assist gates 10 to 13 and the control gate 30 from each other. However, it is also possible to use a silicon oxide film containing nitrogen as an additive or a silicon nitride film.

In this embodiment, 2-bit information is stored in the storage node 50 at 4 levels. It is needless to say, however, that 1-bit information and information of 3 or more bits can also be stored. In a multilevel programming operation, it is also possible to adopt the programming operation method according to this embodiment for a high threshold voltage level requiring a large threshold voltage shift and another programming operation method for a low threshold voltage level. As an alternative, this embodiment or another embodiment of the present invention can be properly selected according to the threshold voltage level. This feature can also be applied to other embodiments of the present invention as well.

Figure 5:
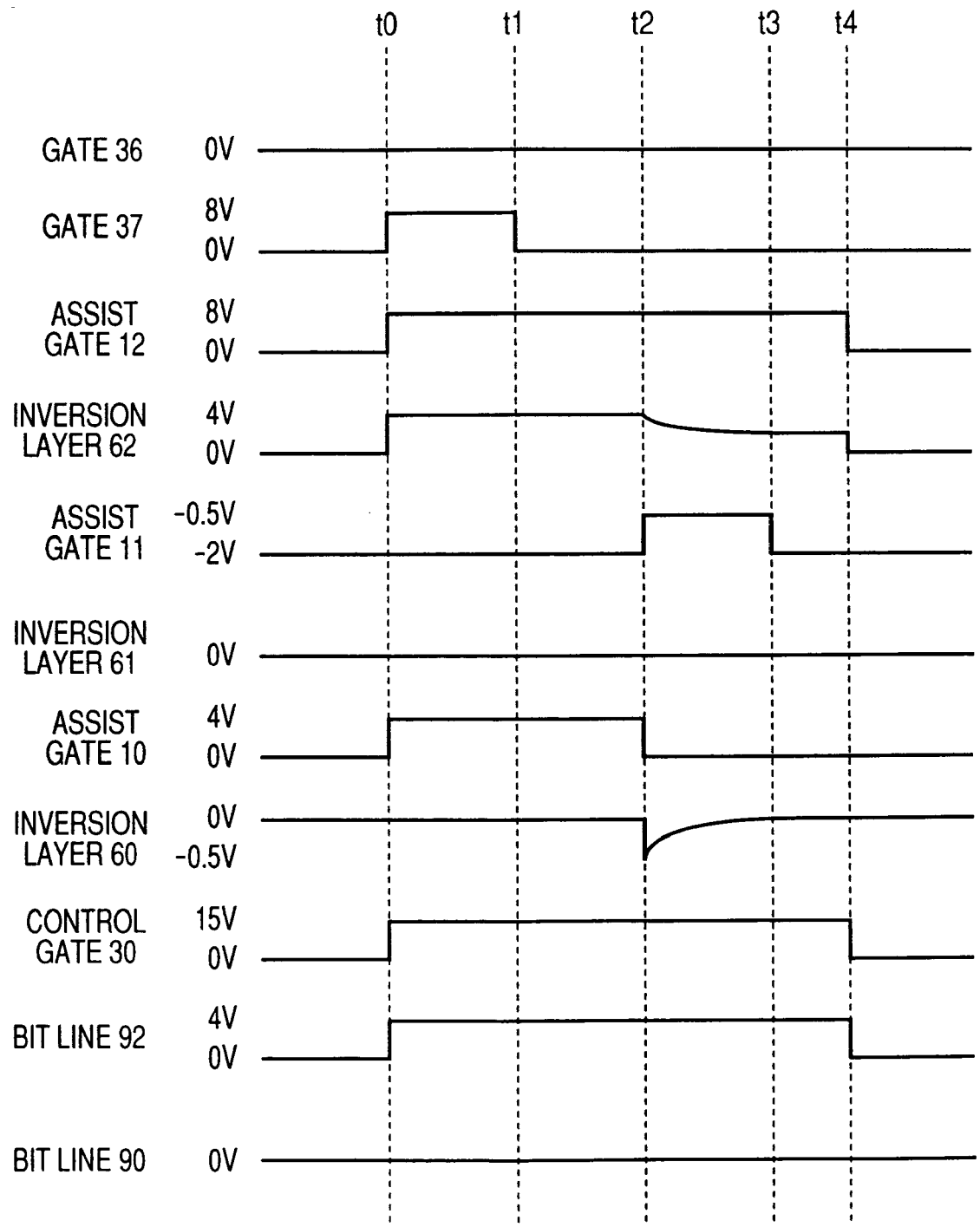
FIG. 5 shows timing diagrams of a procedure for applying voltages to members of an array of memory cells in a programming operation of the nonvolatile semiconductor memory device according to the embodiment of the present invention.

In this embodiment, the voltage at the assist gate 12 is pulled up to activate the assist gate 12 and, then, the voltage of the surface of the p-type well 3 below the assist gate 12 is pulled up to 4V by coupling to activate the surface in order to provide a programming drain voltage to the inversion layer 62. However, the programming drain voltage can also be generated by adoption of another method. For example, as shown in FIG. 5, at a time t0, a voltage at the gate 37 of a select MOS transistor is pulled up to 8V to activate the select MOS transistor, a voltage appearing on the bit line 92 is pulled up to at 4V to activate the bit line 92, a voltage at the assist gate 12 is pulled up to 8V to activate the assist gate 12, and a voltage at the inversion layer 62 created below the assist gate 12 is set at 4V. After that, at a time t1, by pulling down the voltage at the gate 37 of the select MOS transistor to 0V to deactivate the select MOS transistor, a drain voltage of 4V may be pre-charged in the inversion layer 62. The method described above as a method of providing power as a programming drain voltage can also be adopted in all other embodiments of the present invention as well.

In this embodiment, by pulling down the voltage at the assist gate 10, the inversion layer 60 is set by coupling transiently at a negative voltage of typically −0.5V. Instead of the assist gate 11, a voltage at a portion or whole of the unselected control gate 31 can also be pulled down to deactivate the unselected control gate 31 in order to give the same effects. If the voltage at the unselected control gate 31 is pulled down, a voltage at a storage node below the control gate 31 decreases and, furthermore, a voltage at the inversion layer 60 becomes negative due to coupling between the storage node below the unselected control gate 31 and the inversion layer 60. Instead of pulling down the voltage at the assist gate 10, the voltage at the control gate 31 can be decreased to. In this case, timing diagrams can be obtained by substituting the control gate 31 for the assist gate 10, 0V for the voltage prior to the pulling-down operation and −2V for the voltage after the pulling-down operation in the timing diagrams shown in FIG. 1. The levels of the voltage before and after the pulling-down operation are not limited to these values. That is, the levels of the voltages before and after the pulling-down operation can be positive, 0V or negative as long as the level of the voltage after the pulling-down operation is lower than the level of the voltage prior to the pulling-down operation. In addition, the voltages of the assist gate 10 and the control gate 31 can also be pulled down at the same time.

Figure 6:
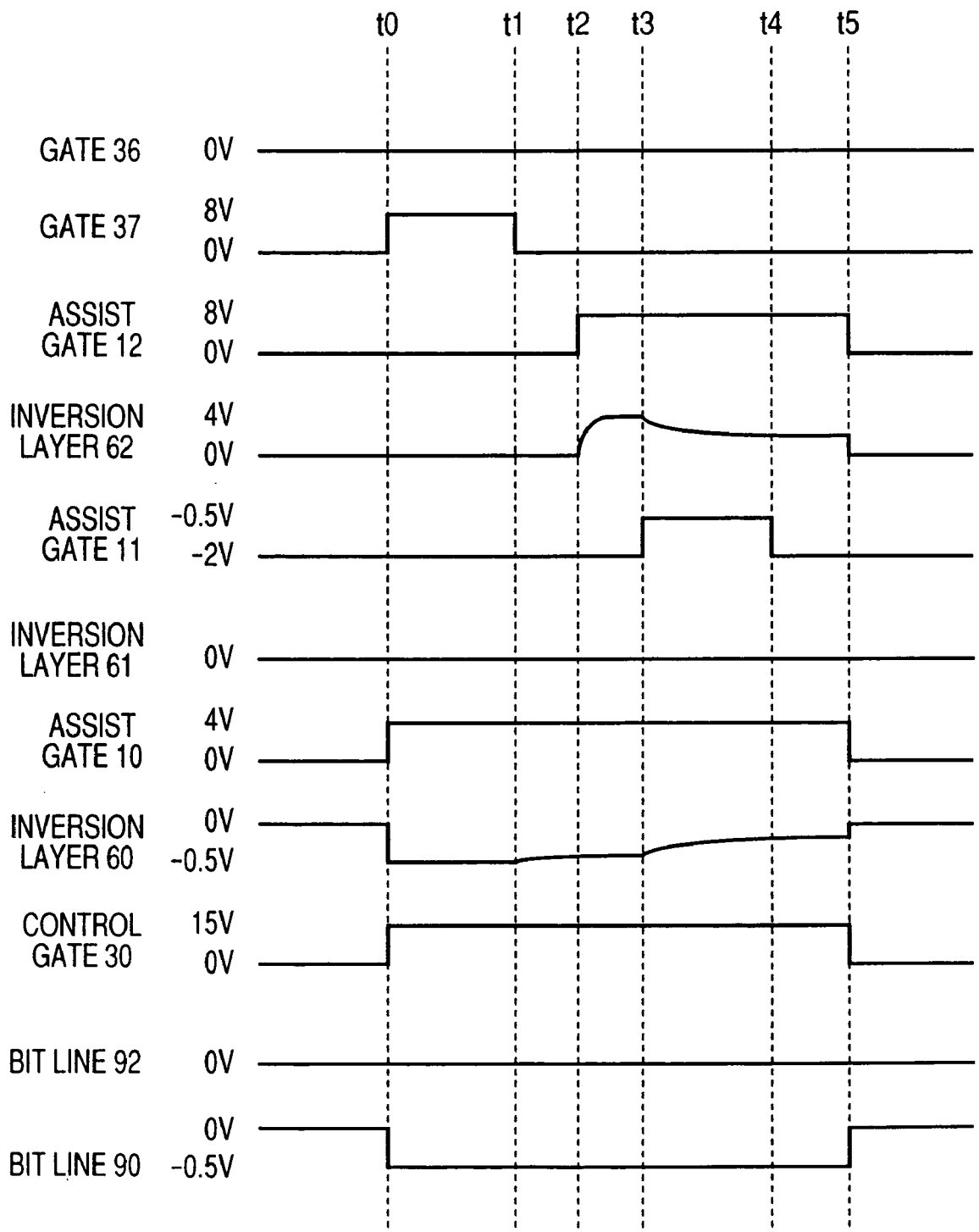
FIG. 6 shows timing diagrams of a procedure for applying voltages to members of an array of memory cells in a programming operation of the nonvolatile semiconductor memory device according to the embodiment of the present invention.

Furthermore, in the method shown in FIG. 6, a negative voltage can be pre-charged into the inversion layer 60. At a time t0, the gate 37 of the select MOS transistor is pulled up to a voltage of 8V to activate the select MOS transistor, the global bit line 90 is pulled down to a voltage of −0.5V, the assist gate 10 is pulled up to a voltage of 4V to activate the assist gate 10, and a voltage at the inversion layer 60 created below the assist gate 10 is set at −0.5V. Subsequently, at a time t1, the gate 37 of the select MOS transistor is pulled down to a voltage of 0V to deactivate the select MOS transistor in order to pre-charge a source voltage of −0.5V in the inversion layer 60. In this case, it is not necessary to pull down the voltage at the assist gate 10 at a time t3. That is, the voltage at the assist gate 10 can be pulled down to deactivate the assist gate 10 at another time such as a time t5. With a negative voltage pre-charged into the inversion layer 60, a voltage is applied as a bias in the forward direction between the p-type well 3 and the inversion layer, causing a current to flow between the p-type well 3 and the inversion layer 60. As a result, the voltage at the inversion layer 60 increases toward 0V. The method described above as a method of supplying a programming source voltage can also be adopted in all other embodiments of the present invention as well.

In this embodiment, the time to pull down the voltage at the assist gate 10 is set at a time coinciding with the time t3 to pull up the voltage at the assist gate 11. However, the time to pull down the voltage at the assist gate 10 can be set at any time as long as the time is between the time t1 and the time t4. If the time to pull down the voltage at the assist gate 10 is set at a time too earlier than the time t3, however, most electrons accumulated in the inversion layer 60 below the assist gate 10 will flow to the p-type well 3, lessening the effect of increasing the programming speed. If the time to pull down the voltage at the assist gate 10 is set at a time too later than the time t3, on the other hand, most electrons accumulated in the inversion layer 60 will be discharged to the inversion layer 62, lessening the effect of increasing the programming speed as well. If the time to pull down the voltage at the assist gate 10 is set at a time coinciding with the time t3, dispersions caused by dispersions of characteristics of the assist gate 11 as dispersions of programming characteristics of the memory cell can be reduced provided that the time it takes to pull down the voltage at the assist gate 10 is 500 ns. If the timing to pull down the voltage at the assist gate 10 and the time it takes to pull down the voltage at the assist gate 10 are both adjusted, the dispersions of programming characteristics of the memory cell can be reduced effectively. The above descriptions of the timing to pull down the voltage at the assist gate 10 and the time it takes to pull down the voltage at the assist gate 10 also hold true of all other embodiments of the present invention as well.

In the case of this embodiment and all other embodiments, the time to pull up and pull down the voltage at every other element to activate and deactivate the element is also not limited to the time described so far. That is, the time can be changed to any of a variety of times in a range not deviating from essentials of the present invention. In the case of the timing diagrams shown in FIG. 1, for example, voltages appearing at the gate 37, the assist gate 10 and the control gate 30 are pulled up at the time t0 to activate the select MOS transistor, the assist gate 10 and the control gate 30, respectively. However, the time charts are not intended to indicate that the voltages of the gate 37, the assist gate 10 and the control gate 30 must be pulled up to activate the select MOS transistor, the assist gate 10 and the control gate 30 respectively at exactly the same time. Instead, the time charts are intended to imply that such voltage conditions are set at the time t0.

In addition, in this embodiment, the voltage at the assist gate 10 after the pulling-down operation is set at 0V. However, the voltage at the assist gate 10 after the pulling-down operation is set at any level as long as the level is below a voltage at the assist gate 10 as a result of the pulling-up/activation operation. Moreover, in this embodiment, the voltage at the assist gate 11 prior to the pulling-up/activation operation and after the pulling-down/deactivation operation is −2V whereas the voltage at the assist gate 11 after the pulling-up/activation operation is −0.5V. However, these values of the voltage are no more than typical values. That is, the voltage at the assist gate 11 prior to the pulling-up/activation operation and after the pulling-down/deactivation operation whereas the voltage at the assist gate 11 after the pulling-up/activation operation can each be set at another level. For example, the voltage at the assist gate 11 prior to the pulling-up/activation operation and after the pulling-down/deactivation operation can be set at a level of 0V whereas the voltage at the assist gate 11 after the pulling-up/activation operation can be set at a level of 0.5V. As another example, the voltage at the assist gate 11 prior to the pulling-down/deactivation operation and after the pulling-up/activation operation can be set at a level of 0V whereas the voltage at the assist gate 11 after the pulling-down/deactivation operation can be set at a level of −0.5V.

Furthermore, in this embodiment, the voltage at the global bit line 90 is fixed at 0V and a voltage of 0V is pre-charged into the inversion layer 60. However, the voltage at the global bit line 90 and the voltage pre-charged into the inversion layer 60 are not limited to a level of 0V. That is, the voltage at the global bit line 90 and the voltage pre-charged into the inversion layer 60 can each be positive or negative and can each be adjusted according to necessity. The above descriptions of the voltages of the assist gate 10, the global bit line 90 and the inversion layer 60 also hold true of all other embodiments of the present invention as well. In the case of this embodiment and all the other embodiments of the present invention, the value of a voltage set at every other element is not limited to the described value of the voltage. That is, the value of each voltage can be changed to any of a variety of values in a range not deviating from essentials of the present invention.

Second Embodiment

Next, a second embodiment of the present invention is explained by referring to FIGS. 1 to 3 and 8. This embodiment is different from the first embodiment in that the embodiment has a programming operation different from that of the first embodiment.

In the case of the first embodiment, at the time t2, the voltage at the assist gate 12 is pulled up to activate the assist gate 12 and the voltage appearing on the surface of the p-type well 3 below the assist gate 12 is pulled up to 4V by coupling to activate the surface. After that, at a time t3, the voltage at the assist gate 11 is pulled up to activate the assist gate 11 and a programming operation is carried out. In the case of this embodiment, on the other hand, at a time earlier than the time t2, the voltage at the assist gate 11 is set and a programming operation is carried out. Thus, it is possible to reduce the dispersions of the programming characteristics of the memory cell caused by dispersions of the rise timing of the voltage at the assist gate 11 and dispersions of the rise time of the voltage at the assist gate 11. In the timing diagrams shown in FIG. 8, the voltage at the assist gate 11 is set at the time t0. However, the timing to set the voltage at the assist gate 11 is not limited to the time t0. The timing to set the voltage at the assist gate 11 can be any time as long as the timing is not later than the time t2. In addition, at a time not later than t0, the voltage at the assist gate 11 can be fixed at a programming voltage. In particular, if a programming operation is carried out with the voltage of the assist gate 11 set at 0V, by fixing the voltage at the assist gate 11 set at 0V with a timing prior to the time t0, a power supply for pulling up and pulling down the voltage at the assist gate 11 can be eliminated so that the region of a power-supply circuit can be shrunk substantially.

Except for the differences described above, the programming operation of this embodiment is carried out in a way identical with the programming operation of the first embodiment. In addition, the read and erase operations of this embodiment are carried out also in the same way as the read and erase operations of the first embodiment.

According to this embodiment, the speed of the operation to program information into memory cells can be increased and, at the same time, it is possible to reduce the dispersions of the programming characteristics of the memory cell caused by dispersions of the rise timing of the voltage at the assist gate 11 and dispersions of the rise time of the voltage at the assist gate 11. In addition, the speed of the operation to program information into the memory cells can be increased and, at the same time, the region of a power-supply circuit can be shrunk.

Third Embodiment

Next, a third embodiment of the present invention is explained by referring to FIGS. 1, 2, 9 and 10. The configuration of the flash memory according to this embodiment and the programming operation of the memory are different from those of the first embodiment.

Figure 9:
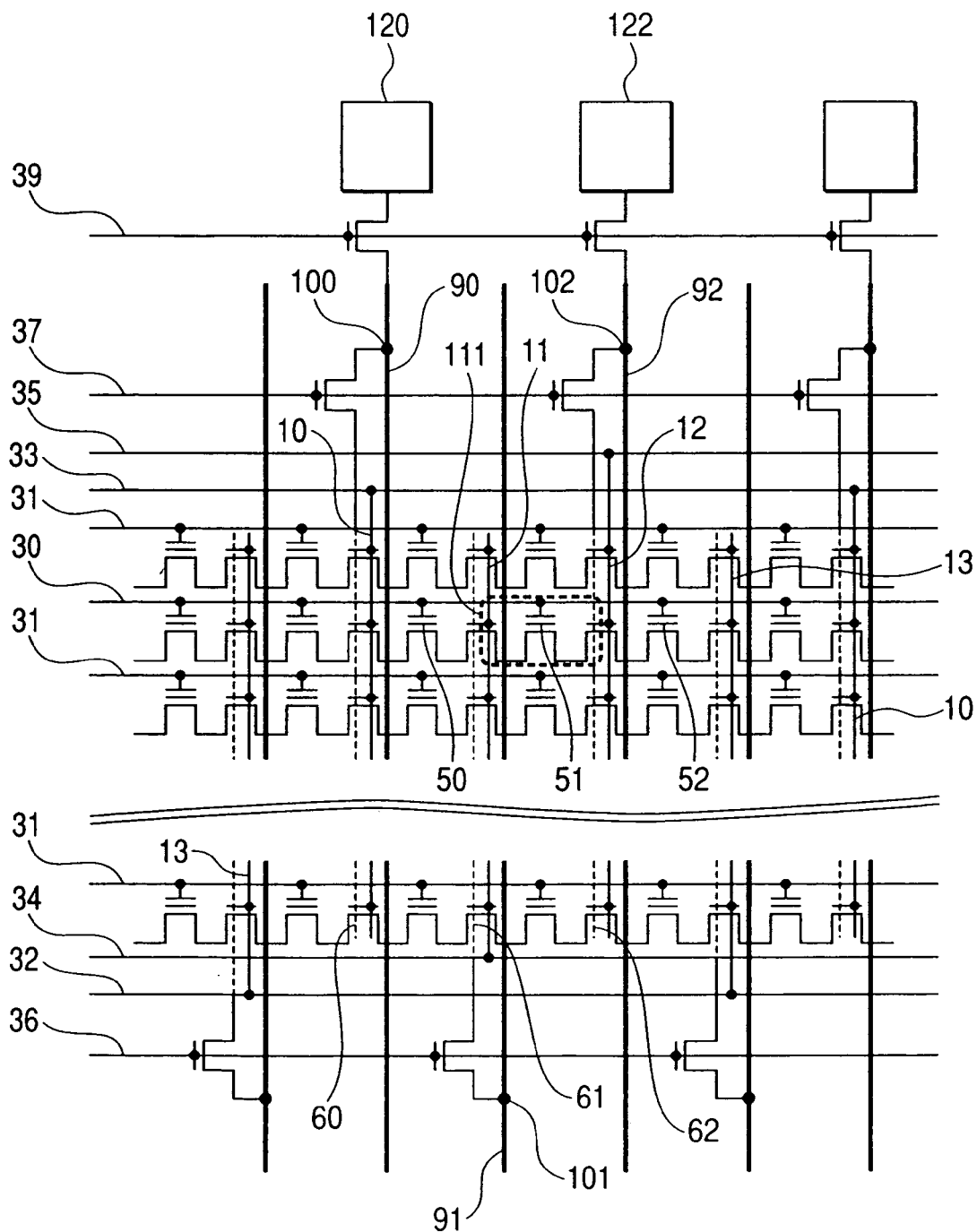
FIG. 9 is a circuit diagram showing principal elements composing a nonvolatile semiconductor memory device according to another embodiment of the present invention.

The configuration of the flash memory according to this embodiment is shown in FIG. 9. The configuration of the flash memory according to this embodiment is different from the configuration of the memory array shown in FIG. 3 in that a global bit line 91 is provided between the global bit lines 90 and 92, the common source line 150 is eliminated, and select MOS transistors each having a gate 39 are provided between the global bit line 90 and the internal power supply 120 as well as between the global bit line 92 and the internal power supply 122. As for the programming operation, a source voltage of 0V is pre-charged into both the global bit line 90 and the inversion layer 60 whereas a drain voltage of 4V is pre-charged into both the global bit line 92 and the inversion layer 62.

Figure 10:
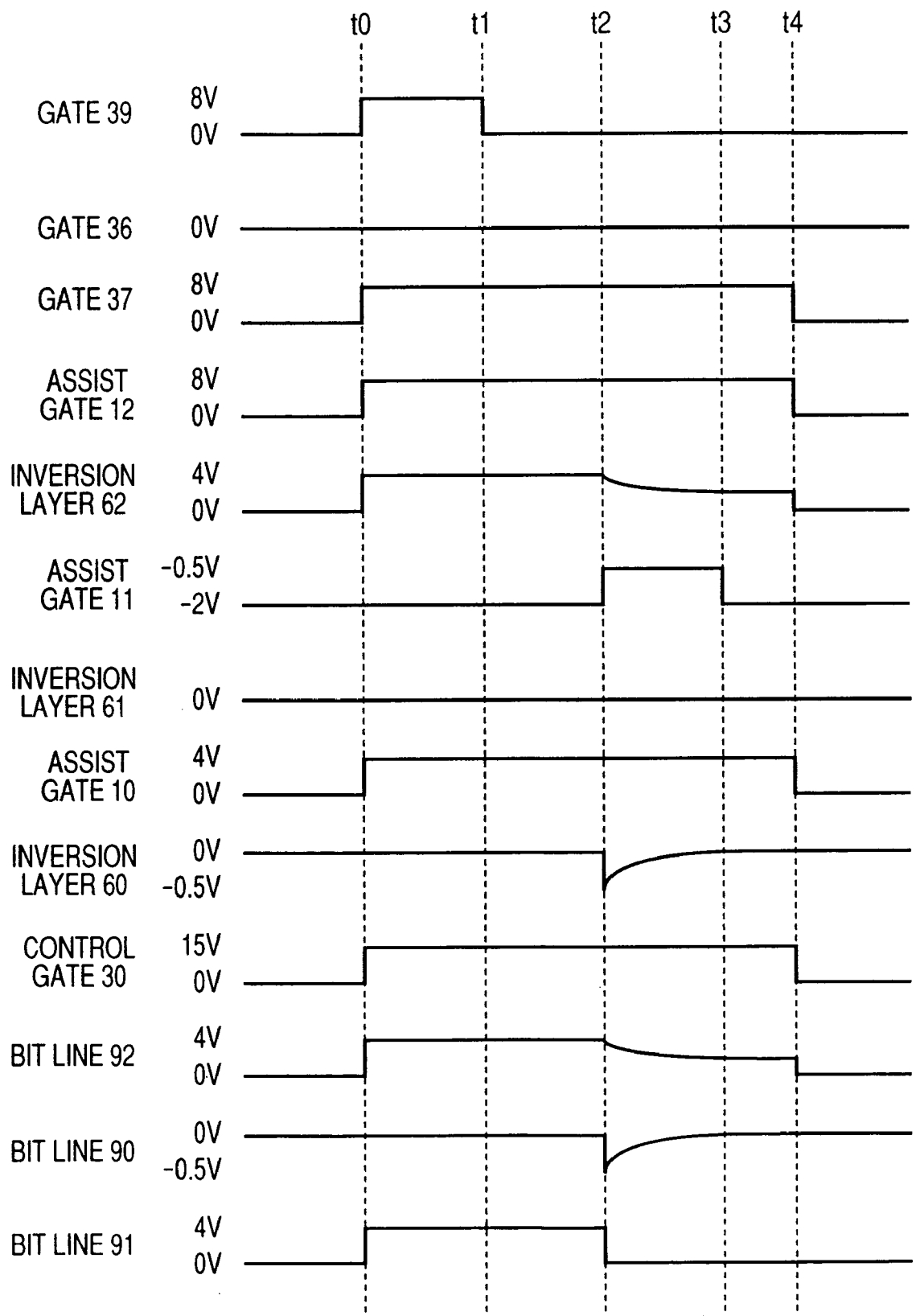
FIG. 10 shows timing diagrams of a procedure for applying voltages to members of an array of memory cells in a programming operation of the nonvolatile semiconductor memory device according to the other embodiment of the present invention.

A programming operation of this embodiment is explained by referring to FIG. 10. At a time t0, voltages of the gates 37 and 39, the bit lines 91 and 92, the assist gates 10 and 12, as well as the control gate 30 are pulled up to activate the gates 37 and 39, the bit lines 91 and 92, the assist gates 10 and 12, as well as the control gate 30. Since the power supplies 120 and 122 have been set 0V and 4V respectively in advance, the voltages of the global bit line 90 and the inversion layer 60 become 0V whereas the voltages of the global bit line 92 and the inversion layer 62 become 4V. Subsequently, at a time t1, the voltage at the gate 39 of the select MOS transistor is pulled down to deactivate the select gate MOS transistor, causing the voltages of the global bit line 90 and the inversion layer 60 to enter a floating state at 0V as they are whereas the voltages of the global bit line 92 and the inversion layer 62 to enter a floating state at 4V as they are. In this way, the operations to pre-charge the source voltage of 0V and the drain voltage of 4V are completed. Then, at a time t2, the voltage at the assist gate 11 is pulled up to activate the assist gate 11, the voltage at the global bit line 91 is pulled down, and the operation to program information into the storage node 51 is carried out. In this embodiment, when the voltage at the global bit line 91 is pulled down, by coupling, the voltages of the bit line 90 and the inversion layer 60 in a state of being conductive to the global bit line 90 are decreased to a negative level of typically −0.5V so that the programming operation can be carried out at a speed higher than the speed of the programming operation with the voltages of the global bit line 90 and the inversion layer 60 set at 0V.

Instead of pulling down the voltage appearing on the global bit line 91 the voltage of another element in a state of coupling with the global bit line 90 can also be pulled down in order to result in the same effect. An example of another element in a state of coupling with the global bit line 90 is a wire on an upper layer. In addition, the voltages appearing at the assist gate 10 and the unselected control gate 31 can also be pulled down in order to result in the same effect. As an alternative, a combination of these techniques can also be adopted.

Figure 11:
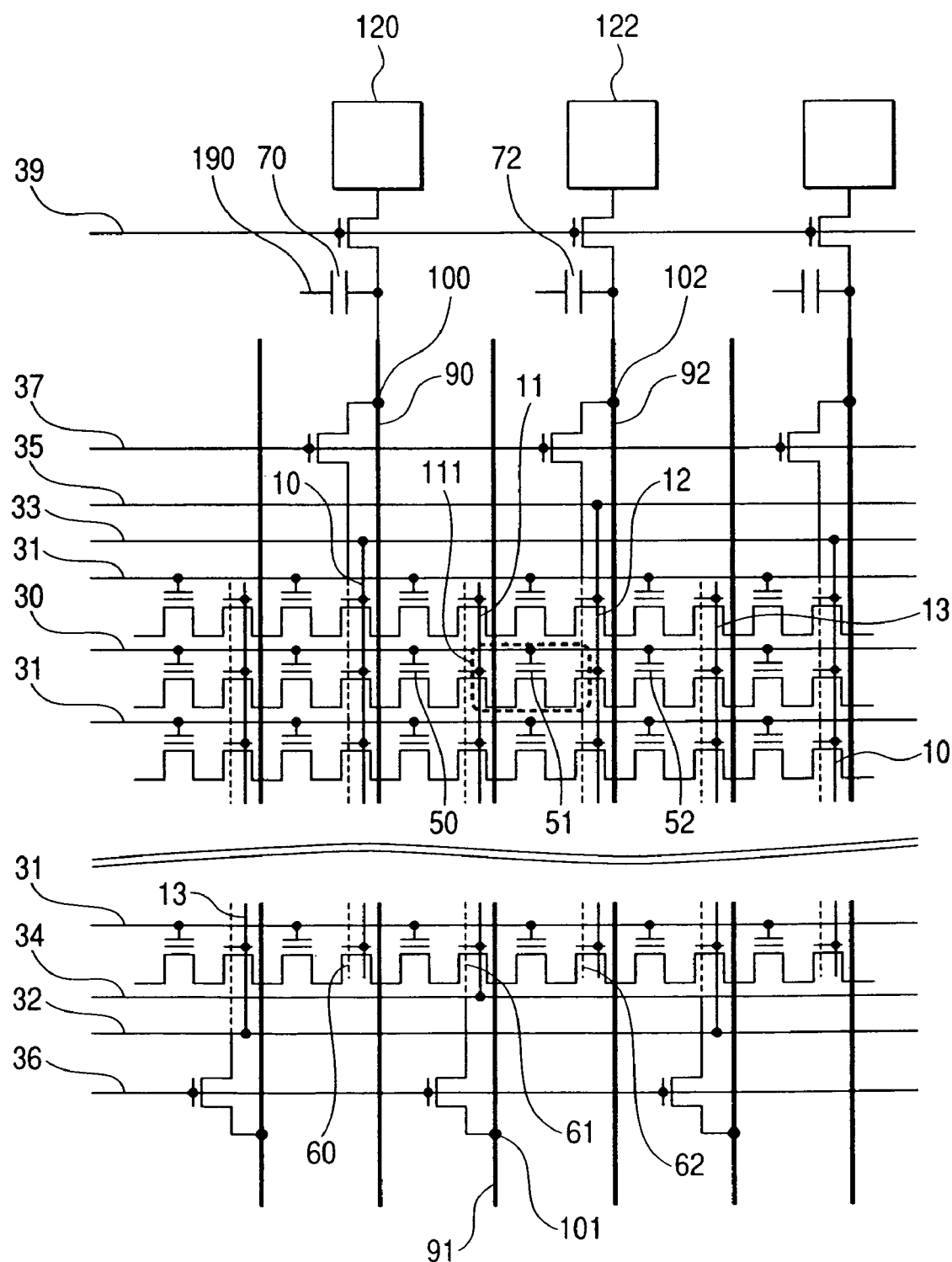
FIG. 11 is a circuit diagram showing principal elements composing a nonvolatile semiconductor memory device according to a further embodiment of the present invention.

Moreover, as shown in FIG. 11, a capacitor 70 is provided between the internal power supply 120 and the global bit line 90. In this configuration, after the electrical charging operation, the voltage at an element 190 in a state of coupling with the capacitor 70 can be pulled down in order to set the voltages of the global bit line 90 and the inversion layer 60 at a negative level. Naturally, the capacitor 70 can also be provided between the global bit line 90 and the inversion layer 60. The method of setting the source voltage at a negative level at a programming time as described above can also be adopted in all embodiments related to the present invention.

According to this embodiment, in comparison with the first embodiment, the quantity Qj of electric charge flowing on the surface of the p-type well 3 below the storage node 51 increases, allowing the programming operation to be carried out at a high speed.

Except for the differences described above, the programming operation of this embodiment is carried out in a way identical with the programming operation of the first embodiment. In addition, the read and erase operations of this embodiment are carried out also in the same way as the read and erase operations of the first embodiment.

Fourth Embodiment

Next, a fourth embodiment of the present invention is explained by referring to FIGS. 1, 2, 9, and 12. The configuration of the flash memory according to this embodiment and the programming operation of the memory are different from those of the third embodiment.

In the case of the third embodiment, at the time t2 to pull down the voltage appearing on the global bit line 91, the voltage at the assist gate 11 is pulled up to activate the assist gate 11 and the programming operation is carried out. In the case of this embodiment, on the other hand, with a timing earlier than the time t2, the voltage at the assist gate 11 is pulled up to activate the assist gate 11 and the programming operation is carried out. It is thus possible to reduce the dispersions of the programming characteristics of the memory cell caused by dispersions of the rise timing of the voltage at the assist gate 11 and dispersions of the rise time of the voltage at the assist gate 11.

Figure 12:
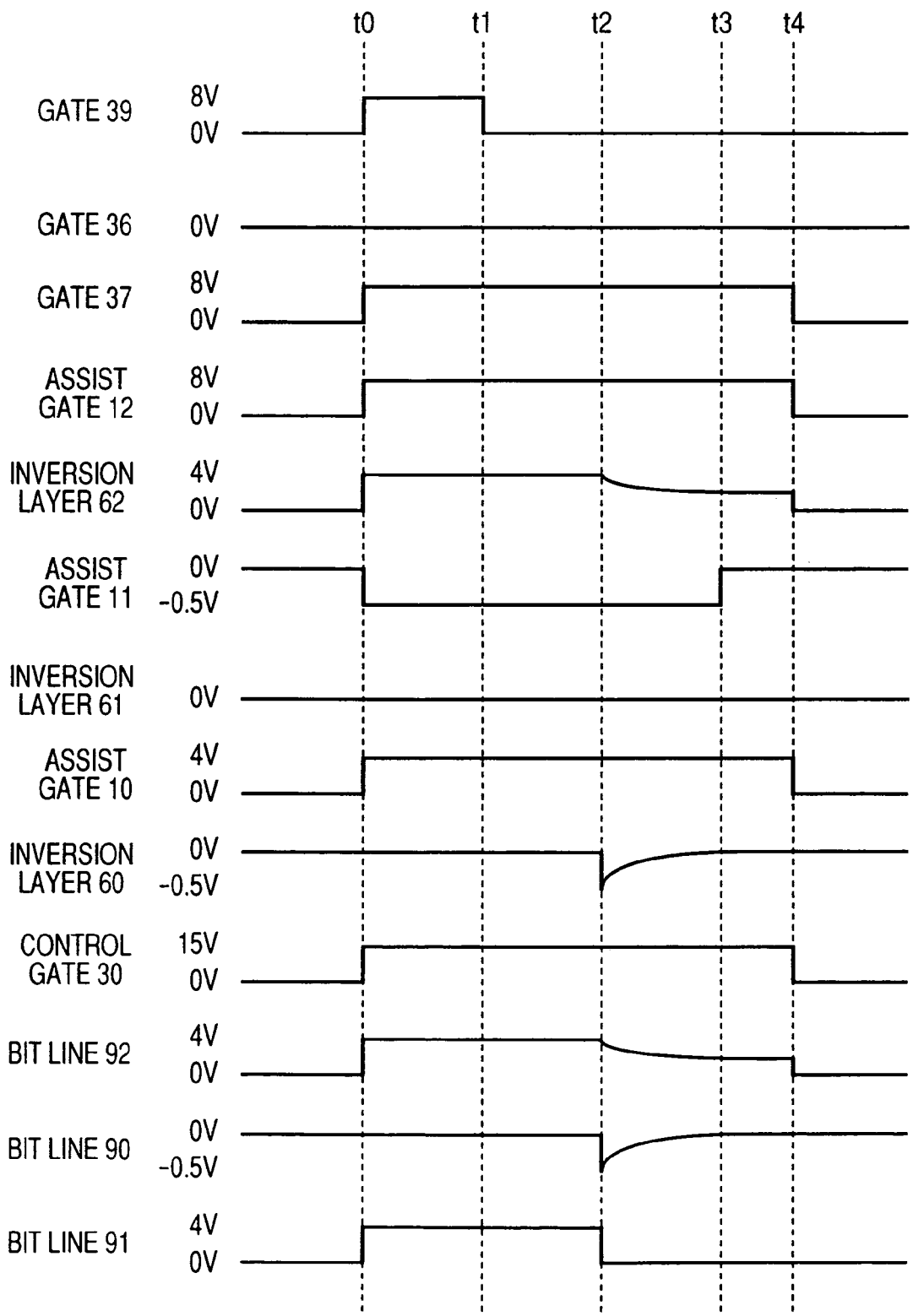
FIG. 12 shows timing diagrams of a procedure for applying voltages to members of an array of memory cells in a programming operation of the nonvolatile semiconductor memory device according to the further embodiment of the present invention.

In the timing diagrams shown in FIG. 12, the voltage at the assist gate 11 is set at the time t0. However, the timing to set the voltage at the assist gate 11 is not limited to the time t0. The timing to set the voltage at the assist gate 11 can be any time as long as the timing is not later than the time t2. In addition, at a time not later than t0, the voltage at the assist gate 11 can be fixed at a programming voltage. In particular, if a programming operation is carried out with the voltage of the assist gate 11 set at 0V, by fixing the voltage at the assist gate 11 set at 0V with a timing prior to the time t0, power supplies for pulling up and pulling down the voltage at the assist gate 11 to respectively activate and deactivate the assist gate 11 can be eliminated so that the region of a power-supply circuit can be shrunk substantially.

Except for the differences described above, the programming operation of this embodiment is carried out in a way identical with the programming operation of the third embodiment. In addition, the read and erase operations of this embodiment are carried out also in the same way as the read and erase operations of the first embodiment.

According to this embodiment, in comparison with the third embodiment, it is possible to reduce the dispersions of the programming characteristics of the memory cell caused by dispersions of the rise timing of the voltage at the assist gate 11 and dispersions of the rise time of the voltage at the assist gate 11. In addition, the speed of the operation to program information into memory cells can be increased and, at the same time, the region of a power-supply circuit can be shrunk.

Fifth Embodiment

Figure 13:
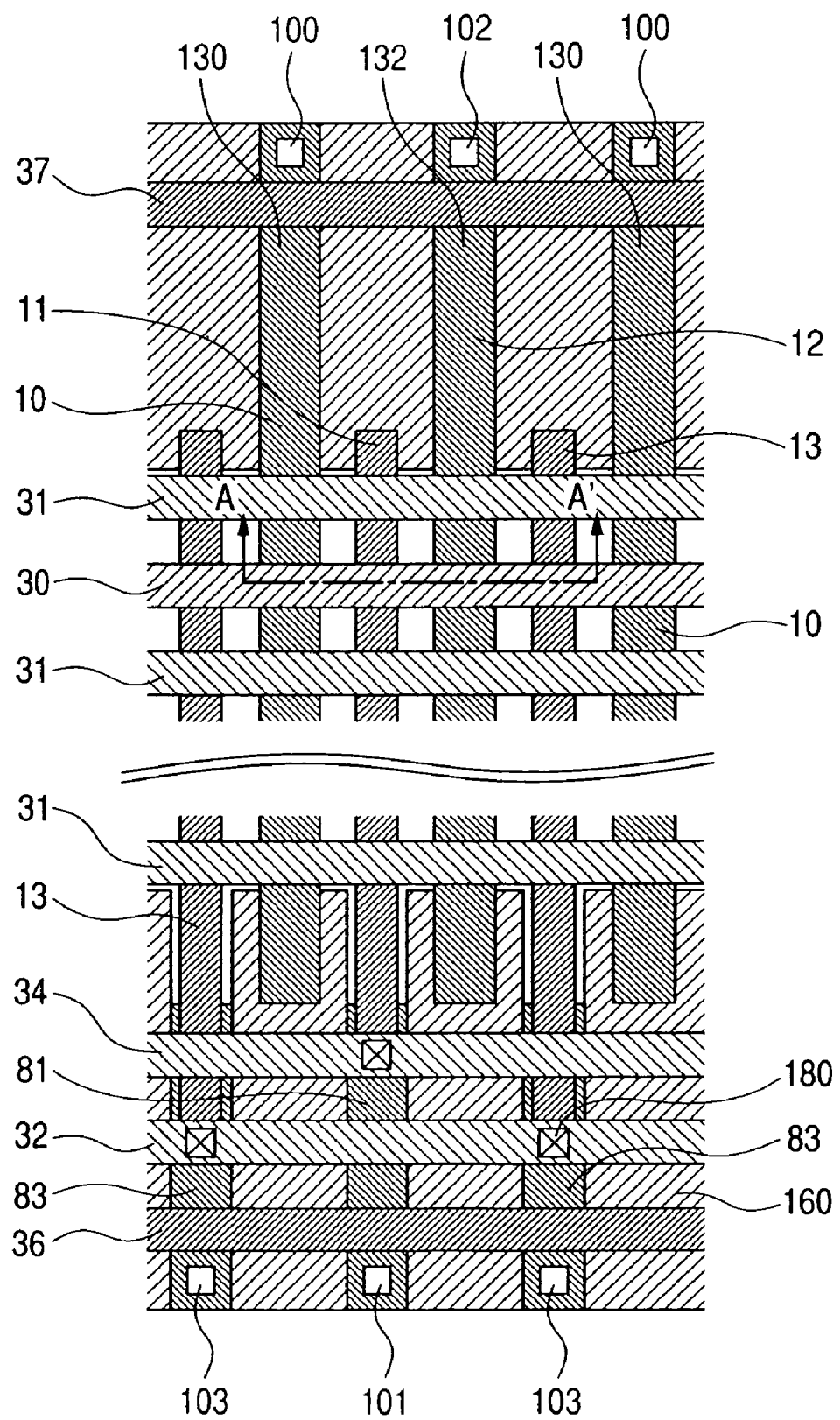
FIG. 13 is a diagram showing a top view of principal elements composing a semiconductor substrate of a nonvolatile semiconductor memory device according to another embodiment of the present invention.
Figure 14:
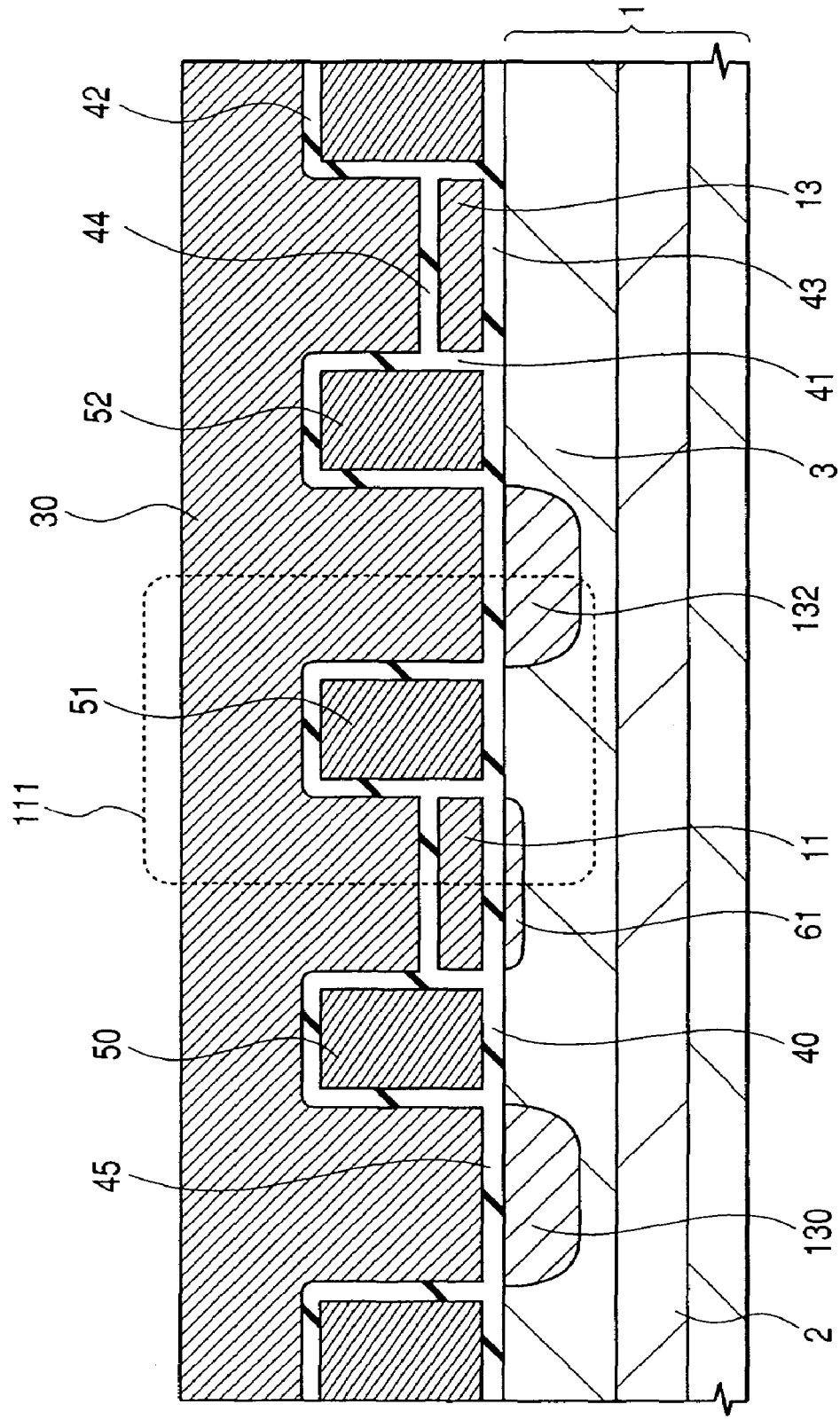
FIG. 14 is a diagram showing a cross section of principal elements composing a semiconductor substrate of a nonvolatile semiconductor memory device according to another embodiment of the present invention.

Next, a fifth embodiment of the present invention is explained by referring to FIGS. 13 and 14. The configuration of the flash memory according to this embodiment and the programming operation of the memory are different from those of the first and third embodiments.

In the case of the first and third embodiments, as shown in FIG. 2, the assist gates 10 and 12 are employed but the active regions 80, 81, 82, and 83 each containing n-type impurities exist not on the inner side of each of control gates at both ends of the memory array. The active regions 80, 81, 82, and 83 are also each referred to as a diffusion layer region. In the case of this embodiment, on the other hand, the assist gates 10 and 12 shown in FIG. 2 are eliminated. In addition, the active regions 80 and 82 each shown in FIG. 2 as a region containing n-type impurities are each extended to an area in close proximity to an electrode 34 used for joining assist gates to create active regions 130 and 132 respectively as shown in FIG. 13. The active regions 81 and 83 overlapping the assist gates 11 and 13 are not modified and remain as they are as shown in FIG. 2. A cross section A-A' shown in FIG. 13 is shown in FIG. 14. In this embodiment, the inversion layers 60 and 62 used for creation of the source and the drain respectively in the first embodiment are replaced with the active regions 130 and 132 respectively to allow the resistance of a local bit line to be reduced at programming and read times. Except for the differences described above, the structure of this embodiment is the same as the first embodiment.

The programming operation of this embodiment can be carried out by adoption of the method according to any one of the first, second, third, and fourth embodiments. If the programming operation of the third or fourth embodiment is to be carried out, naturally, this embodiment needs to be designed into a configuration in which a global bit line 91 is provided between the global bit lines 90 and 92, the common source line 150 is eliminated, and select MOS transistors each having a gate 39 are provided between the global bit line 90 and the internal power supply 120 as well as between the global bit line 92 and the internal power supply 122 as shown in FIG. 9.

Since the structure of this embodiment does not include the assist gates 10 and 12, the operations carried out by the assist gates 10 and 12 are not required either. Thus, the timing diagrams shown in FIG. 4 and the like as timing diagrams of programming operations should be read by ignoring portions of the assist gates 10 and 12. In addition, with the structure of this embodiment, it is impossible to carry out an operation with the source voltage set at a negative level by pulling down the voltage at the assist gate 10 as is the case with the first, second, third, and fourth embodiments. Thus, the operation carried out to set the source voltage at a negative level is replaced with another method such as a technique adopted by the first embodiment as a technique of pulling down the voltage at the unselected control gate 31. The inversion layers 60 and 62 are replaced with the active regions 130 and 132 respectively so that the read operation of this embodiment can be carried out in the same way as the first embodiment. The erase operation of this embodiment can also be carried out in the same way as the first embodiment.

According to this embodiment, the operations carried out by the assist gates 10 and 12 are not required. Thus, the region of an internal power-supply circuit for providing power to the assist gates 10 and 12 can be eliminated.

Sixth Embodiment

Figure 15:
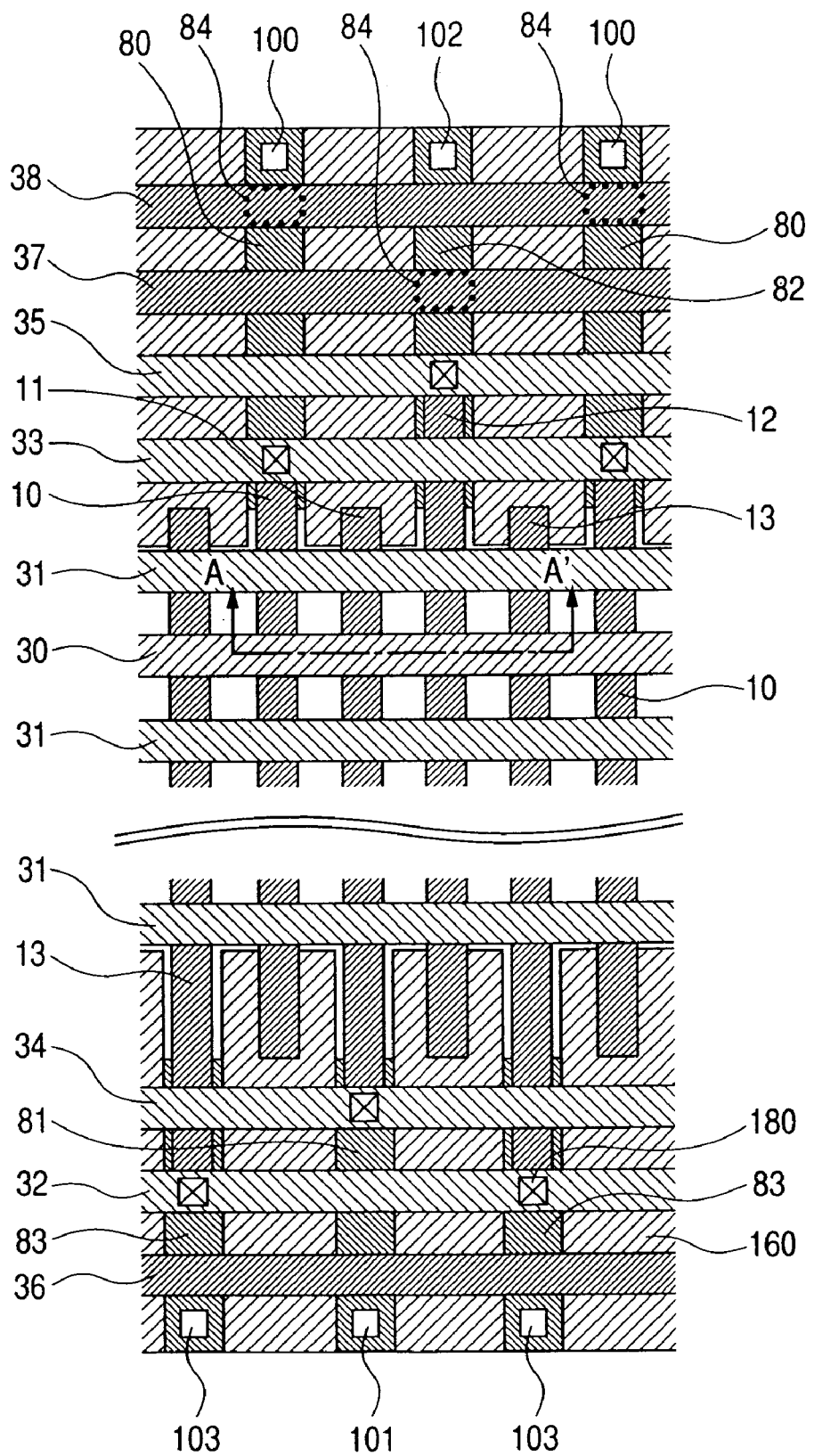
FIG. 15 is a diagram showing a top view of principal elements composing a semiconductor substrate of a nonvolatile semiconductor memory device according to another embodiment of the present invention.
Figure 16:
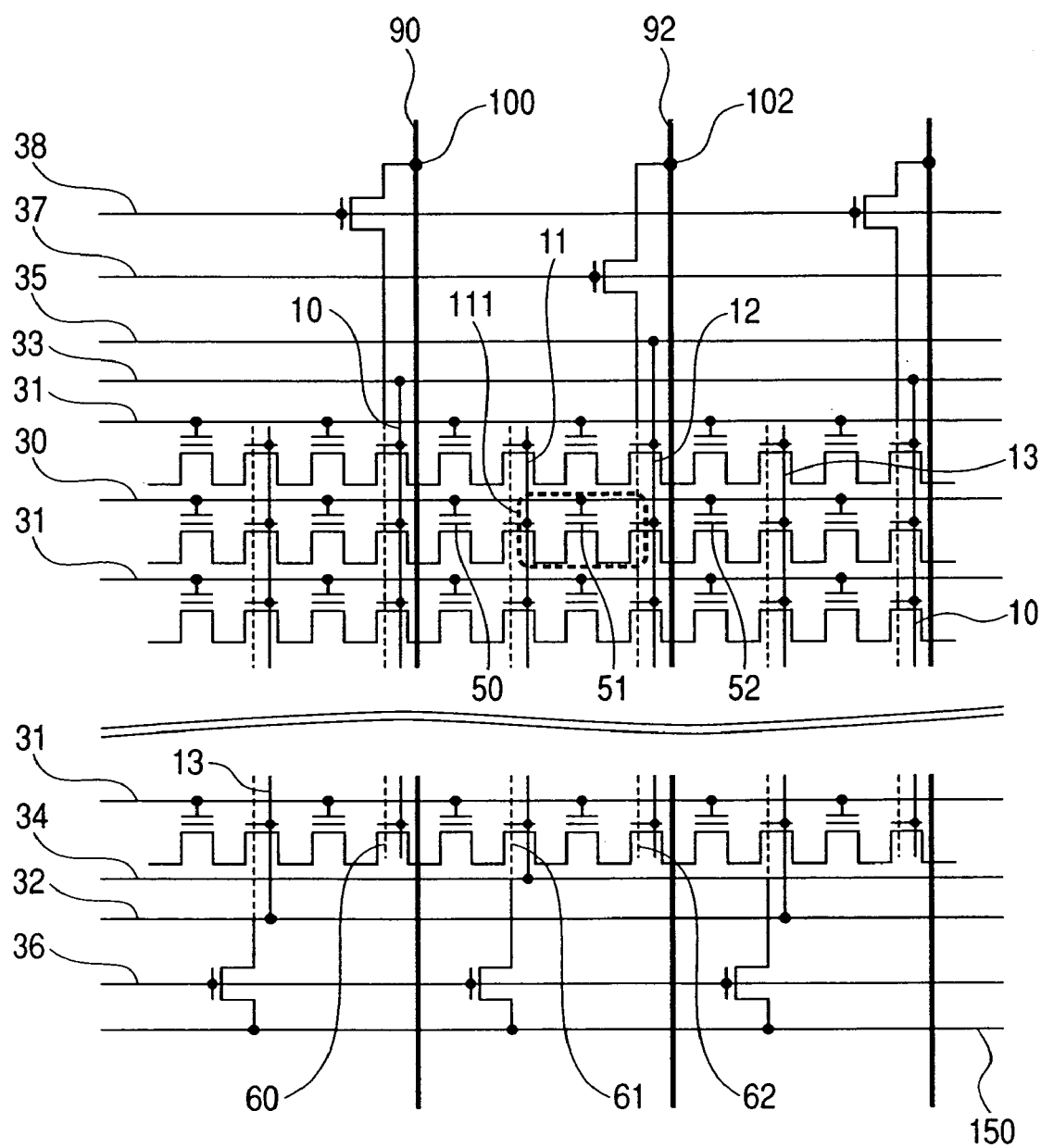
FIG. 16 is a circuit diagram showing principal elements composing a nonvolatile semiconductor memory device according to another embodiment of the present invention.

Next, a sixth embodiment of the present invention is explained by referring to FIGS. 15 and 16. The structure of the flash memory according to this embodiment is different from those of the first and fifth embodiments.

In the case of the first, fifth, and sixth embodiments, one gate of a select MOS transistor is provided at one end of a memory cell array and another gate of a select MOS transistor is provided at the other end of the memory cell array. Thus, the first, fifth, and sixth embodiments each have a structure including a total of 2 gates. In the case of this embodiment, on the other hand, as shown in FIGS. 15 and 16, a further gate 38 of a select MOS transistor is additionally provided on the upper portion of each of the figures. Reference numeral 84 denotes a portion depleted by injection of n-type impurities into the surface of the p-type well 3. The portion 84 is in a conductive state even if the gate 37 or 38 is set at a voltage of 0V.

By adopting the structure described above, an operation to program information into a memory cell 111 can be carried out by putting a local bit line on the source side in a state of being conductive to the global bit line 90 on the source side and a local bit line on the drain side in a floating state insulated from to the global bit line 92 on the drain side. The local bit line on the source side can be put in a state of being conductive to the global bit line 90 on the source side by putting the gate 37 in an ON state and the local bit line on the drain side can be put in a floating state insulated from to the global bit line 92 on the drain side by putting the gate 38 in an OFF state. As an alternative, an operation to program information into a memory cell 111 can be carried out by putting a local bit line on the drain side in a state of being conductive to the global bit line 92 on the drain side and a local bit line on the source side in a floating state insulated from to the global bit line 90 on the source side. The local bit line on the drain side can be put in a state of being conductive to the global bit line 92 on the drain side by putting the gate 38 in an ON state and the local bit line on the source side can be put in a floating state insulated from to the global bit line 90 on the source side by putting the gate 37 in an OFF state. An example of the local bit line on the source side is the inversion layer 60 in the structure of the first embodiment whereas an example of the local bit line on the drain side is the inversion layer 62 in the structure of the first embodiment.

Figure 17:
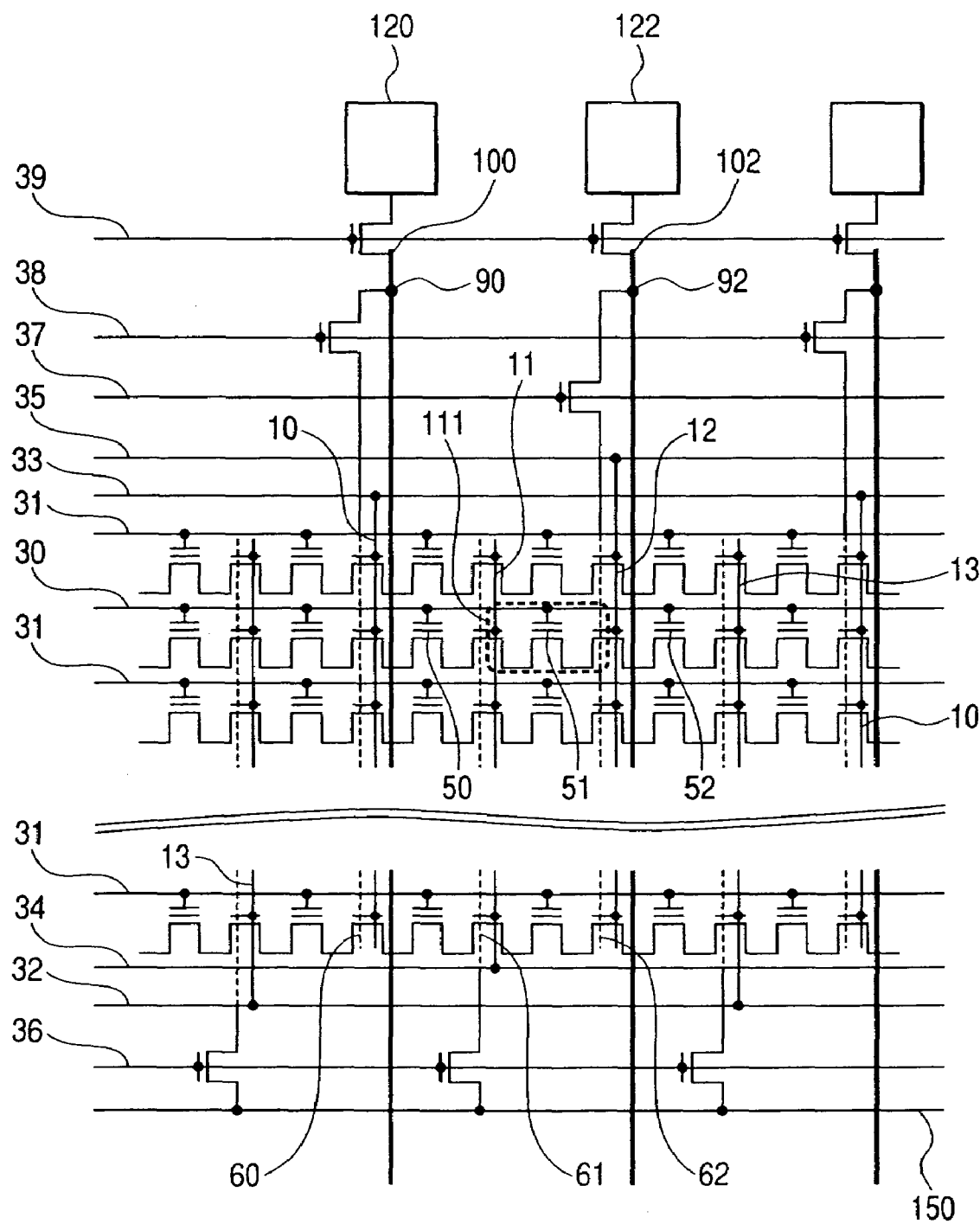
FIG. 17 is a circuit diagram showing principal elements composing a nonvolatile semiconductor memory device according to another embodiment of the present invention.

In addition, as shown in FIG. 17, it is possible to provide a structure in which a select MOS transistor having a gate 39 is provided between the internal power supply 120 and the global bit line 90 as well as between the internal power supply 122 and the global bit line 92. In such a structure, an operation to program information into a memory cell 111 can be carried out with both the local bit line and the global bit line pre-charged by either one of the source and the drain whereas only the local bit line pre-charged by the other one of the source and the drain.

Furthermore, it is possible to provide a structure in which another select MOS transistor is provided between the gate 39 of the select MOS transistor and the internal power supply 120, another select MOS transistor is provided between the gate 39 of the select MOS transistor and the internal power supply 122, and the gate 39 is wired to the gate of the other select MOS transistor in the same way as the gate 37 is wired to the gate 38. In such a structure, an operation to program information into a memory cell 111 can be carried out with the local bit line put in a state of being conductive to the internal power supply for either one of the source and the drain whereas both the local bit line and the global bit line pre-charged by the other one of the source and the drain.

Also in the case of this embodiment, capacitors 70 and 71 can be provided as shown in FIG. 11. With such a configuration, naturally, the number of techniques for providing source and drain voltages at a programming time can be further increased.

The programming operation of this embodiment conforms to the programming operations carried out by other embodiments of the present invention. For example, a pre-charging operation is carried out for both the source and the drain and the voltage at an element in a state of coupling with the capacitor on the source side is pulled-down at a programming time in order to set the source to a negative voltage. As an alternative, a voltage of 4V is applied directly from the internal power supply 122 to a local bit line on the drain side and the voltage at an element in a state of coupling with the capacitor on the source side is pulled down at a programming time in order to set the source to a negative voltage without carrying out a pre-charging operation on the source side. In addition, a programming operation can also be carried out by pre-charging a voltage of 4V onto the drain side and applying a voltage of −0.5V directly from the internal power supply 120 to a local bit line on the source side.

In the typical structures shown in FIGS. 15, 16 and 17, the assist gates 10 and 12 are provided and local bit lines are created on the inversion layers 60 and 62 as is the case with the structure of the first embodiment. However, the structure of the flash memory is not limited to the typical structures shown in FIGS. 15, 16 and 17. The flash memory can also be properly designed into a structure like the one shown in FIG. 13 or 15.

The number of gates each provided for a select MOS transistor can be increased by creation of as many gates as required on the upper and lower sides. If the number of gates each provided for a select MOS transistor is raised, a proper voltage is given to each of the gates so as to obtain conduction necessary for programming and read operations carried out in this embodiment.

Seventh Embodiment

Figure 7:
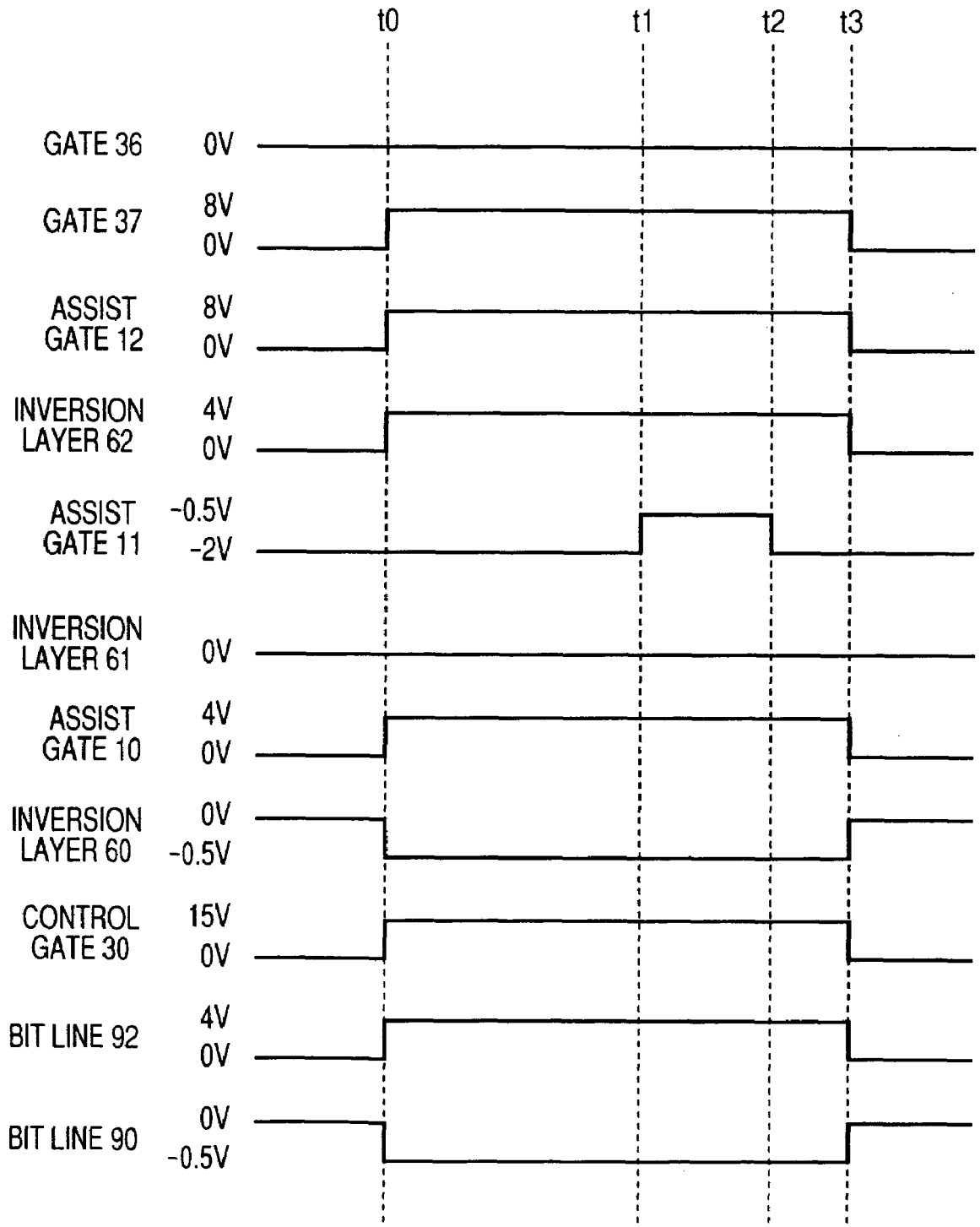
FIG. 7 shows timing diagrams of a procedure for applying voltages to members of an array of memory cells in a programming operation of the nonvolatile semiconductor memory device according to the embodiment of the present invention.
Figure 8:
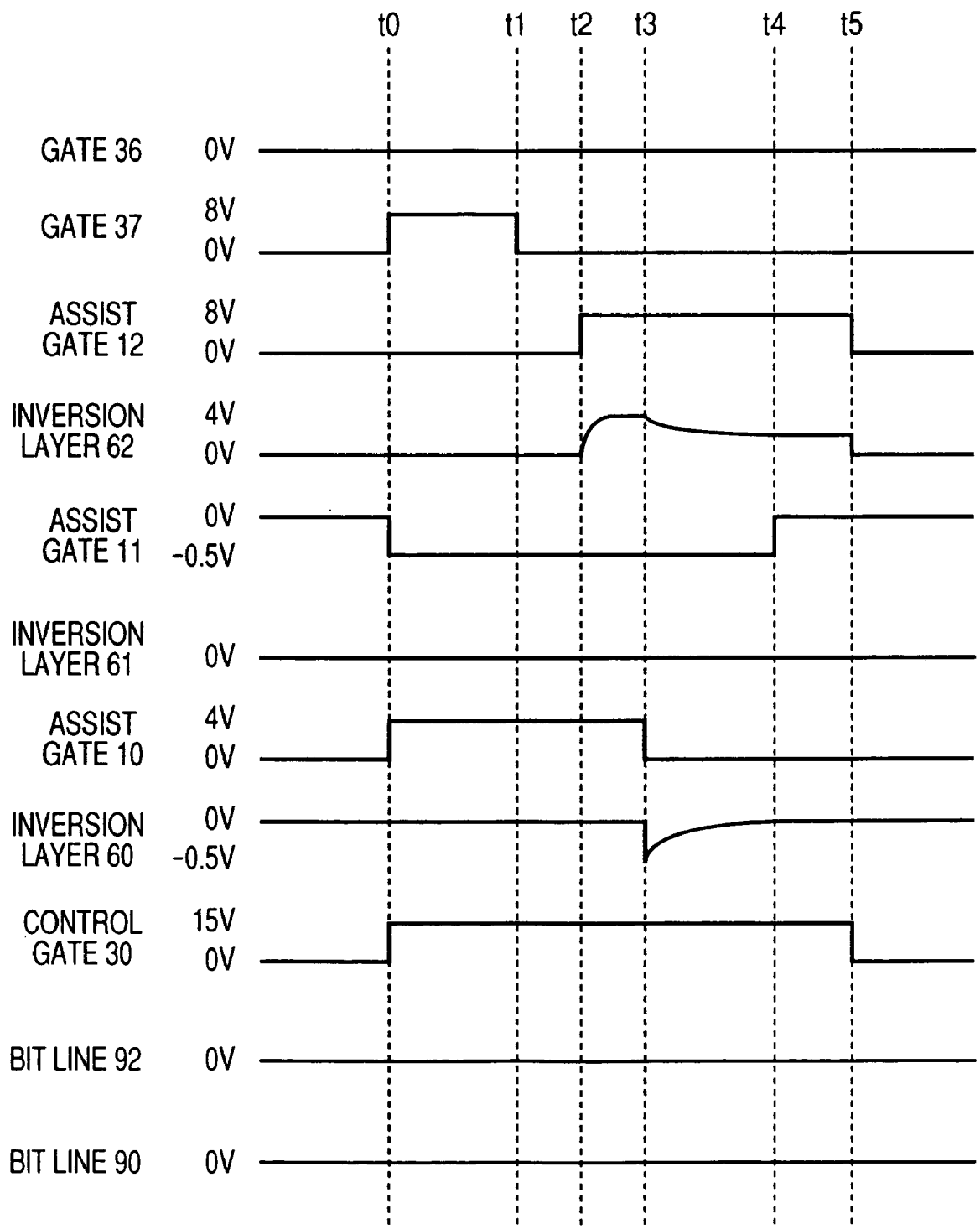
FIG. 8 shows timing diagrams of a procedure for applying voltages to members of an array of memory cells in a programming operation of the nonvolatile semiconductor memory device according to the embodiment of the present invention.

Next, a seventh embodiment of the present invention is explained by referring to FIG. 7. The programming operation of this embodiment is different from those carried out in the first to sixth embodiments.

The programming operation carried out in this embodiment is explained by referring to the structure of any one of the first to sixth embodiments. During a programming cycle, the local bit line is put in a state of being conductive to the power supply. In particular, the programming operation carried out in this embodiment is explained by referring to the structure of the first embodiment as follows. As shown in FIG. 7, in a programming cycle, first of all, the voltage at the gate 37 is pulled up to activate the gate 37 in order to put the global bit line 92 in a state of being conductive to the inversion layer 62 and the global bit line 90 in a state of being conductive to the inversion layer 60. Then, the global bit line 92 is set at a voltage of 4V while the global bit line 90 is set at a voltage of −0.5V to carry out a programming operation.

By carrying out the operations to set voltages as described above, the programming operation can be performed at a speed higher than the programming operation done by setting the inversion layer 60 at a fixed voltage of 0V. Since the programming operation is carried out by adoption of a method of supplying voltages directly from internal power supplies to local bit lines on both the drain and source sides, however, dispersions in programming characteristics increase.

Except for the differences described above, the operations of this embodiment are carried out in the same way as the first to sixth embodiments.

Eighth Embodiment

Figure 18:
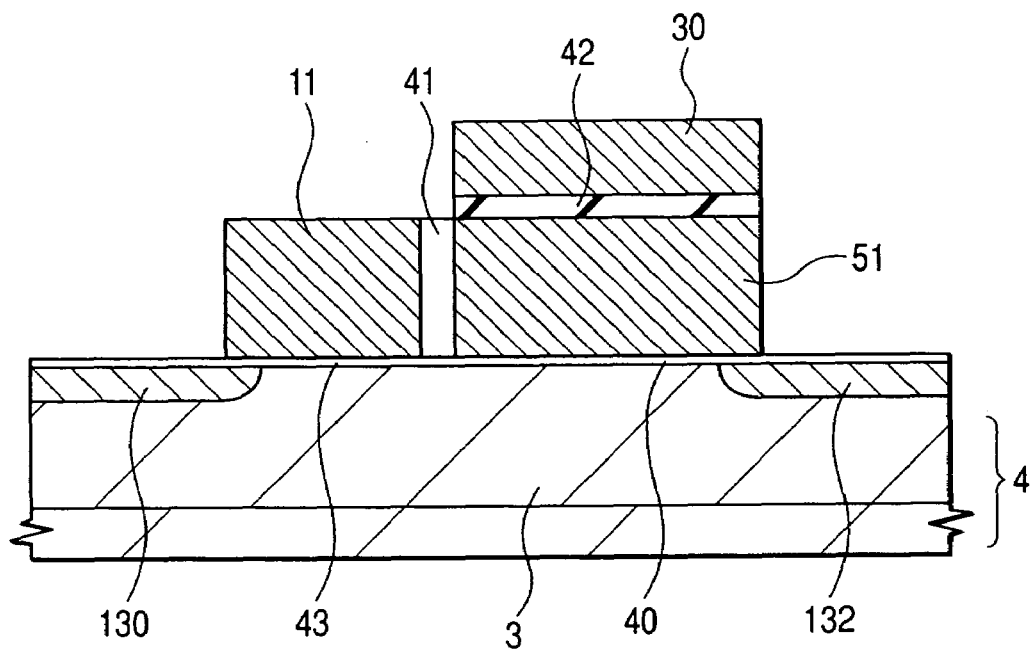
FIG. 18 is a diagram showing a cross section of principal elements composing a semiconductor substrate of a nonvolatile semiconductor memory device according to another embodiment of the present invention.

Next, an eighth embodiment of the present invention is explained by referring to FIG. 18. Every element shown in the figure as an element identical with its counterpart employed in the first embodiment is denoted by the same reference numeral as the counterpart.

FIG. 18 is a diagram showing a cross section of principal elements composing a memory cell according to this embodiment. On a substrate 4 made of monolithic silicon, a p-type well 3 is created. Over the p-type well 3, an assist gate 11 made of n-type polysilicon as an electrode for controlling a voltage appearing on the surface of the p-type well 3 is created, sandwiching an insulator film 43 made of a silicon oxide film in conjunction with the p-type well 3. In addition, over the p-type well 3, a storage node 51 made of polysilicon is created, sandwiching a tunnel insulator film 40 made of a silicon oxide film in conjunction with the p-type well 3. Over the storage node 51, a control gate 30 is provided, sandwiching a silicon oxide film 42 in conjunction with the storage node 51. The control gate 30 is an electrode having a stacked-layer structure comprising an n-type polysilicon film and a W (tungsten) film. The storage node 51 is enclosed by an insulator film provided in the surroundings of the storage node 51, being put in a floating state. This structure is repeated to form a memory cell array.

Figure 19:
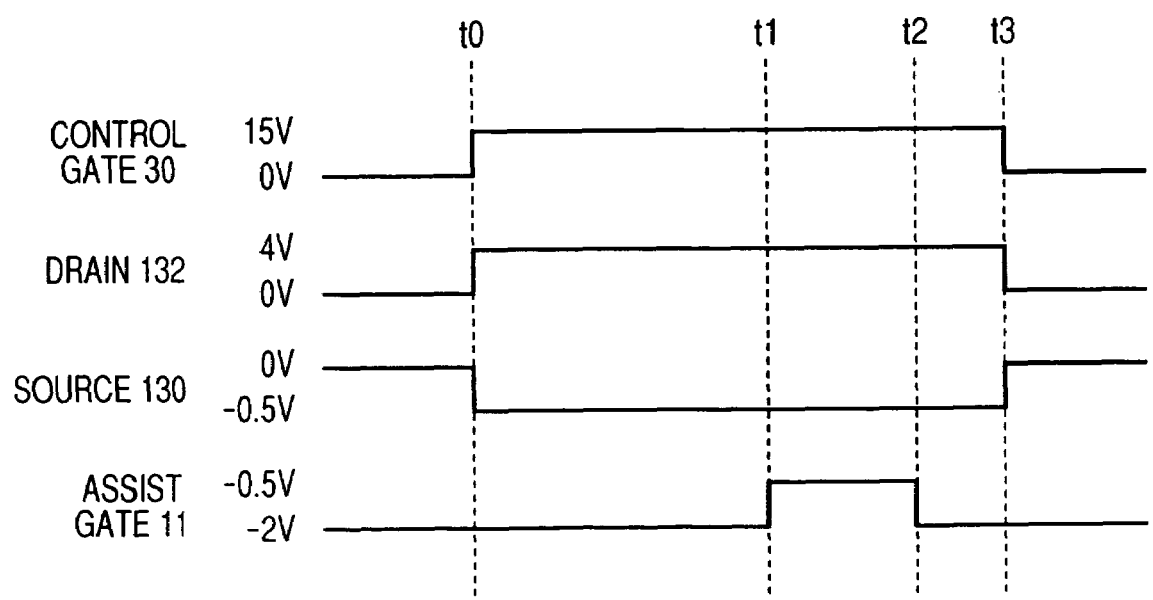
FIG. 19 shows timing diagrams of a procedure for applying voltages to members of an array of memory cells in a programming operation of a nonvolatile semiconductor memory device according to another embodiment of the present invention.

Next, the programming operation of this embodiment is explained by referring to FIG. 19. At a time t0, a voltage at the control gate 30 is pulled up to 15V to activate the control gate 30, a voltage at an active region 132 serving as the drain is pulled up to 4V, and a voltage at an active region 130 serving as the source is pulled down to −0.5V. Subsequently, when a voltage at the assist gate 11 is pulled up to a programming voltage of −0.5V at a time t1, electrons flow from the active region 130 serving as the source to the active region 132 serving as the drain by way of the surface of the p-type well 3 below the storage node 51. This embodiment is characterized in that, by setting the active region 130 serving as the source at a negative voltage at that time, electrons flow between the active region 130 serving as the source and the active region 132 serving as the drain in spite of the fact that the assist gate 11 has been set at a negative voltage.

The surface of the p-type well 3 below the assist gate 11 has a high resistance while the surface of the p-type well 3 below the storage node 51 has a low resistance. In this case, if the difference in voltage between the active region 130 serving as the source and the active region 132 serving as the drain exists, an electric field is concentrated on the border between the surface of the p-type well 3 below the assist gate 11 and the surface of the p-type well 3 below the storage node 51, generating hot electrons. Since the voltage at the control gate 30 is high, the generated hot electrons are attracted in a direction toward the control gate 30, flying over a potential barrier of a tunnel insulator film 40. The hot electrons are eventually injected into the storage node 51, causing information to be stored.

Then, at a time t2, the voltage at the assist gate 11 is pulled down to deactivate the assist gate 11 in order to terminate the process to inject hot electrons into the storage node 51. Subsequently, at a time t3, the voltages appearing at the control gate 30, the active region 132 serving as the drain are pulled down to 0V, and the voltage appearing at the active region 130 serving as the source is pulled up to 0V. The operations described above are carried out in 1 cycle of the programming procedure. The voltage at the p-type well 3 is fixed at 0V throughout the one cycle of the programming operation as shown in none of the time charts of FIG. 19.

In this embodiment, since the surface of the p-type well 3 below the assist gate 11 has a high resistance, the magnitude of the current flowing between the active region 130 serving as the source and the active region 132 serving as the drain is not so large so that hot electrons can be injected at a high efficiency in comparison with a configuration including no assist gate structure. Thus, even if an operation to program information into numerous memory cells is carried out at the same time, a number of bits can be input and output at one time without the current consumption becoming an excessively large value.

Figure 20:
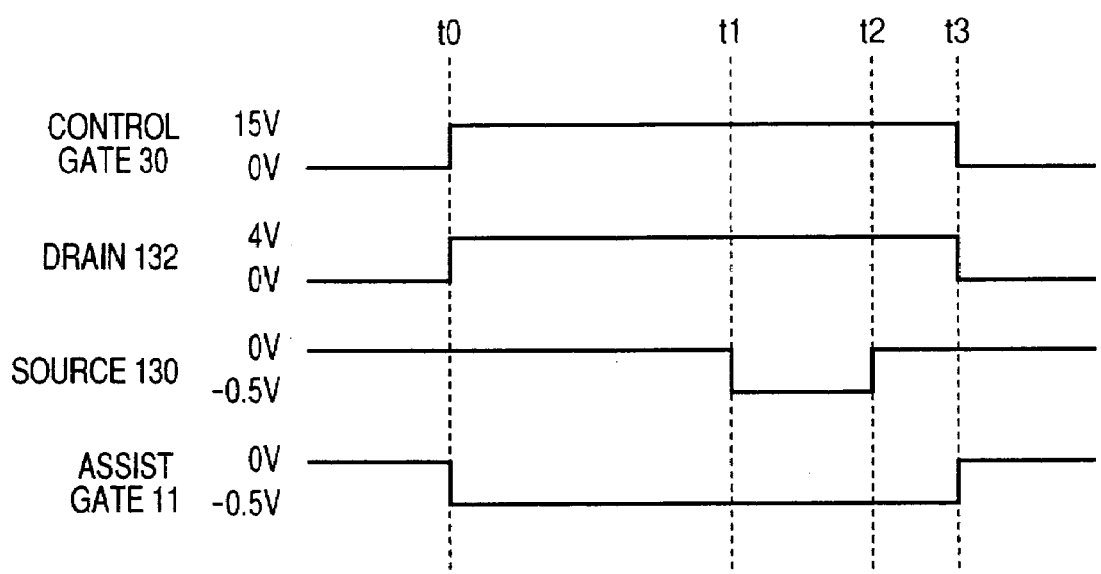
FIG. 20 shows timing diagrams of a procedure for applying voltages to members of an array of memory cells in a programming operation of a nonvolatile semiconductor memory device according to another embodiment of the present invention.
Figure 21:
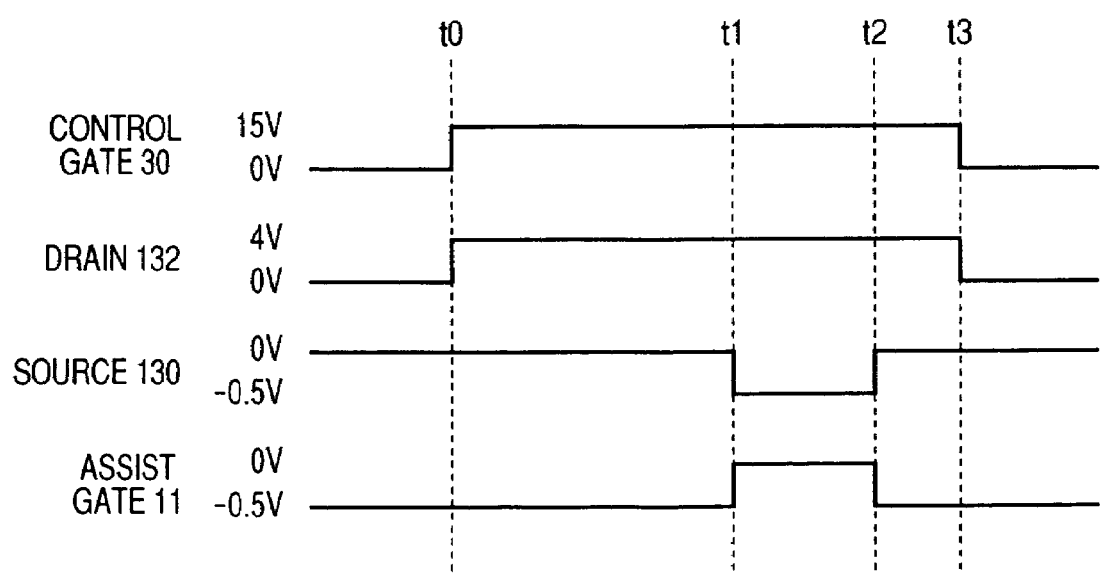
FIG. 21 shows timing diagrams of a procedure for applying voltages to members of an array of memory cells in a programming operation of a nonvolatile semiconductor memory device according to another embodiment of the present invention.

As shown in FIG. 19, the programming timing is controlled by pulling up and down the voltage at the assist gate 11 in order to respectively activate and deactivate the assist gate 11. As shown in FIG. 20, however, the programming timing can also be controlled by pulling down and up the voltage at the active region 130 serving as the source. In addition, the voltage at the assist gate 11 can also be pulled up to activate the assist gate 11 while the voltage at the active region 130 serving as the source is pulled down at the same time as shown in FIG. 21. Also in this case, the voltage at the p-type well 3 is fixed at 0V throughout the one cycle of the programming operation.

The following description explains a principle provided by the present invention as a principle allowing the programming operation to be carried out at a high speed. As described earlier, this embodiment is characterized in that, by setting the active region 130 serving as the source at a negative voltage, electrons flow between the active region 130 serving as the source and the active region 132 serving as the drain in spite of the fact that the assist gate 11 has been set at a negative voltage, allowing a programming operation to be carried out. Thus, 3 effects described below are obtained and the speed of the operation to program information into a memory cell is increased as is the case with the first embodiment explained earlier by referring to FIG. 25. The quantity Qg of electric charge injected into the storage node 51 is represented by an equation of Qg=Qj×γ, where notation Qj denotes the quantity of electric charge moving between the active region 130 serving as the source and the active region 132 serving as the drain whereas notation γ denotes the efficiency of injection of hot electrons.

The injection efficiency γ is a function of the voltage at the storage node 51, the voltage at the active region 132 serving as the drain, the voltage at the active region 130 serving as the source, and the voltage at the assist gate 11. Even though the injection efficiency γ actually changes during a programming operation, in this case, the injection efficiency γ is approximated to a constant.

As the first effect, a difference in voltage between the active region 132 serving as the drain and the active region 130 serving as the source is increased in comparison with a case in which the voltage at the active region 130 serving as the source is not set at a negative value. The increased difference in voltage between the active region 132 serving as the drain and the active region 130 serving as the source raises the injection efficiency γ of hot electrons.

As the second effect, a difference in voltage between the active region 130 serving as the source and the storage node 51 is increased in comparison with a case in which the voltage at the active region 130 serving as the source is sustained at 0V. The increased difference in voltage between the active region 130 serving as the source and the storage node 51 strengthens an electric field pulling generated hot electrons to the storage node 51 and, hence, raises the injection efficiency γ of hot electrons.

As the third effect, the programming operation can be carried out with the voltage of the assist gate 11 pulled down to a low level of typically −0.5V and at a high injection efficiency γ. Since the lower the voltage at the assist gate 11, the stronger the electric field generated on the boundary between the surface of the p-type well 3 below the assist gate 11 and the surface of the p-type well 3 below the storage node 51, the lower the voltage at the assist gate 11, the higher the injection efficiency γ of hot electrons. If the voltage at the active region 130 serving as the source is sustained at 0V, electrons will not be capable of moving between the active region 132 serving as the drain and the active region 130 serving as the source unless the assist gate 11 is put at a sufficiently high voltage of typically 2V. As is the case with the present invention, however, by bringing the active region 130 serving as the source to a negative voltage of typically −0.5V, a sufficient number of electrons are capable of moving from the active region 130 serving as the source to the inversion layer as an electric charge of the electric-charge quantity Qj even if the assist gate 11 is kept at a voltage of −0.5V. Thus, information can be stored in the storage node 51 at a high injection efficiency γ.

Next, effects provided by the embodiment are described. In general, in order to increase the speed of programming adopting the source-side injection technique, there are 2 methods described as follows. According to the first method, the voltage at the active region 132 serving as the drain is pulled up in order to increase the difference in voltage between the source and the drain and, hence, raise the injection efficiency γ of hot electrons. According to the second method, on the other hand, the voltage at the control gate 30 is raised to pull up the voltage at the storage node 51 by coupling. Thus, since an electric field for pulling in hot electrons is strengthened, the injection efficiency γ of the hot electrons is increased. However, excessively increasing the voltage at the active region 132 serving as the drain will inevitably enhance a drain disturbance, in which electrons injected into the storage node 51 in a memory cell on an unselected word line are pulled in to the active region 132. In addition, if the voltage at the control gate 30 is excessively increased to excessively pull up the voltage at the storage node 51, the other storage node 51 employed in a memory cell on an unselected bit line is also raised, unavoidably enhancing a disturbance in which electrons are injected into the other storage node 51 by an F-N tunnel injection effect. Due to these disturbances, the voltage at the active region 132 serving as the drain and the voltage at the control gate 30 cannot each be increased above a certain level. In addition, even if a high voltage is given to the active region 132 serving as the drain as a bias, the drain voltage appearing on the surface of the p-type well 3 below the storage node 51 will decrease unless the voltage at the storage node 51 is sufficiently high. Since, the drain voltage appearing on the surface of the p-type well 3 below the storage node 51 decreases, the high voltage applied to the diffusion layer as a bias will not reach to the border between the surface of the p-type well 3 below the storage node 51 and the surface of the p-type well 3 below the assist gate 11. So a very big effect cannot be obtained.

According to the method provided by this embodiment, on the other hand, the voltage at the active region 132 serving as the drain and the voltage at the control gate 30 are not changed. Thus, the speed of the operation to program information into a memory cell can be increased without the side effects described above.

In this embodiment, in order to pull in generated electrons to the storage node 51, the voltage at the storage node 51 is increased by coupling between the control gate 30 and the storage node 51. However, the voltage at the storage node 51 can also be raised by coupling between the active region 132 serving as the drain and the storage node 51.

Figure 26:
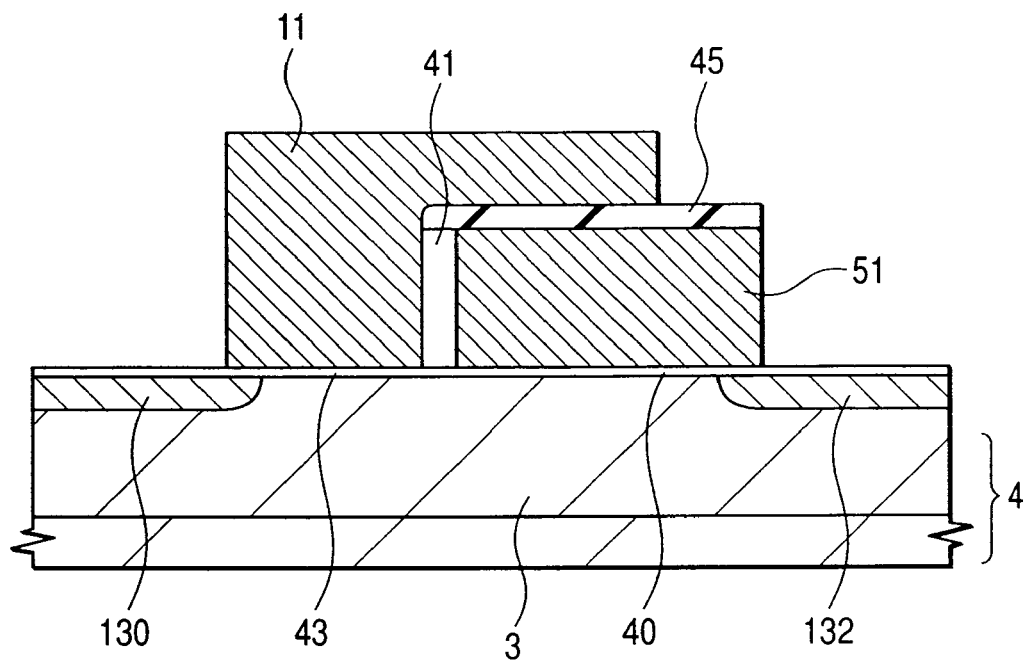
FIG. 26 is a diagram showing a cross section of principal elements composing a semiconductor substrate of a nonvolatile semiconductor memory device according to another embodiment of the present invention.
Figure 27:
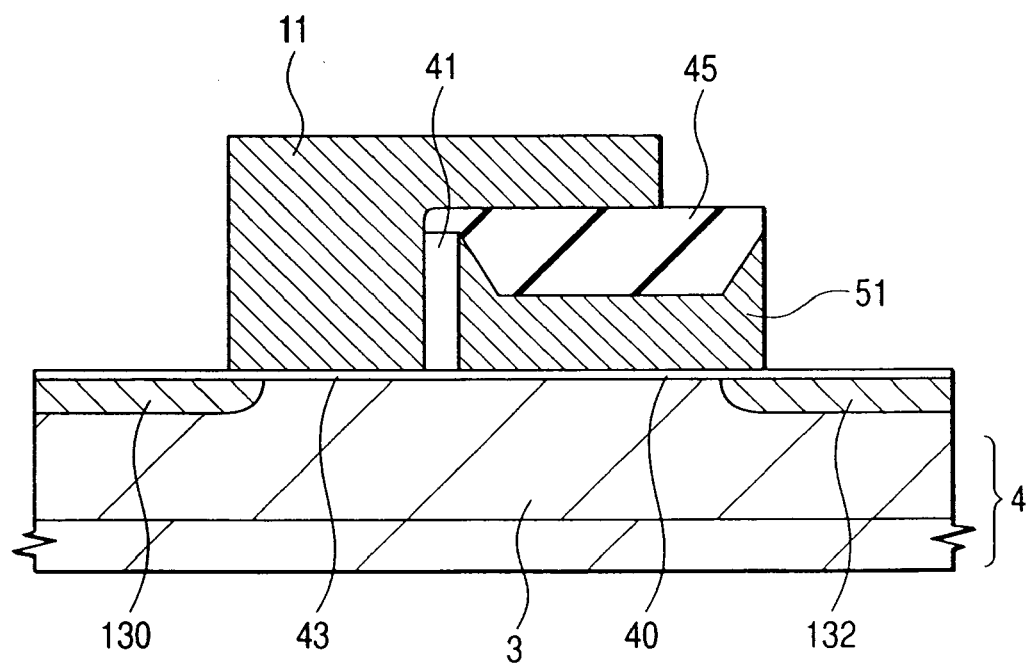
FIG. 27 is a diagram showing a cross section of principal elements composing a semiconductor substrate of a nonvolatile semiconductor memory device according to another embodiment of the present invention.

In addition, as shown in FIGS. 26 and 27, it is possible to have a structure in which the assist gate 11 covers the storage node 51 also to serve as a control gate as well. In the case of the structure shown in FIG. 27, particularly, a high positive voltage of typically 20V is applied as a bias to the assist gate 11 to extract electrons injected into the storage node 51 in an erase operation. In this case, in order to increase the efficiency of extraction of electrons, the end of the storage node 51 is designed into a protruding structure.

Inventions discovered by inventors have been exemplified concretely so far by describing embodiments. However, the scope of the present invention is not limited to the described embodiments. That is, it is need less to say that the present invention can be changed to a variety of modified versions in a range not departing from essentials of the present invention.

The nonvolatile semiconductor memory device provided by the present invention can be properly used as a memory device employed in a personal digital assistant such as a mobile personal computer or a digital still camera.

What is claimed is:

1. A nonvolatile semiconductor memory device comprising:

first and second diffusion layers each disposed on the surface of a semiconductor substrate with a first conduction type as layers each having a second conduction type;

a first electrode disposed over said semiconductor substrate between said first and second diffusion layers, with a first insulator film portion being sandwiched by said first electrode and said semiconductor substrate, said first electrode having a region overlapping said first diffusion layer;

a first storage node disposed adjacent to said first electrode over said semiconductor substrate between said first and second diffusion layers, with a second insulator film portion being sandwiched by said first storage node and said semiconductor substrate, said first storage node being enclosed by another insulator film provided in a region surrounding said first storage node, and said first storage node having a region overlapping said second diffusion layer, said nonvolatile semiconductor memory device carrying out a programming operation in which said semiconductor substrate is set at 0 V, said first diffusion layer is set at a voltage B with a second sign, said first electrode is set at a voltage I having said second sign, and said second diffusion layer is set at a voltage E with a first sign different from said second sign to inject hot carriers, generated in a border region between a surface of said semiconductor substrate in close proximity to said first electrode and a surface of said semiconductor substrate in close proximity to said first storage node, into said first storage node.

2. The nonvolatile semiconductor memory device according to claim 1, said nonvolatile semiconductor memory device also carrying out an operation to set said first electrode at said voltage I and said first diffusion layer at said voltage B at the same time.

3. The nonvolatile semiconductor memory device according to claim 1, said nonvolatile semiconductor memory device also carrying out an operation in which said first diffusion layer is set at said voltage B, and then said first electrode is set at said voltage I.

4. The nonvolatile semiconductor memory device according to claim 1, said nonvolatile semiconductor memory device also carrying out an operation in which said first electrode is set at said voltage I, and then said first diffusion layer is set at said voltage B.

* * * * *